(12) United States Patent
Wang et al.

(10) Patent No.: US 10,964,548 B2
(45) Date of Patent: Mar. 30, 2021

(54) FIN FIELD-EFFECT TRANSISTOR DEVICE AND METHOD

(71) Applicant: Taiwan Semiconductor Manufacturing Company, Ltd., Hsinchu (TW)

(72) Inventors: Yin Wang, New Taipei (TW); Hung-Ju Chou, Taipei (TW); Jiun-Ming Kuo, Taipei (TW); Wei-Ken Lin, Tainan (TW); Chun Te Li, Renwu Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/569,815

(22) Filed: Sep. 13, 2019

(65) Prior Publication Data

US 2020/0006077 A1     Jan. 2, 2020

Related U.S. Application Data

(62) Division of application No. 15/801,194, filed on Nov. 1, 2017, now Pat. No. 10,497,577.

(Continued)

(51) Int. Cl.
*H01L 21/3105* (2006.01)
*H01L 29/78* (2006.01)
(Continued)

(52) U.S. Cl.
CPC ...... *H01L 21/3105* (2013.01); *H01L 21/0217* (2013.01); *H01L 21/02164* (2013.01); *H01L 21/02211* (2013.01); *H01L 21/02247* (2013.01); *H01L 21/02252* (2013.01); *H01L 21/02323* (2013.01); *H01L 21/02337* (2013.01); *H01L 21/31051* (2013.01); *H01L 21/762* (2013.01); *H01L 21/76224* (2013.01);
(Continued)

(58) Field of Classification Search
CPC ............ H01L 29/66795; H01L 29/785; H01L 21/823821; H01L 21/31053
See application file for complete search history.

(56) References Cited

U.S. PATENT DOCUMENTS 8,796,666 B1    8/2014 Huang et al.
8,815,712 B2    8/2014 Wan et al.
(Continued)

FOREIGN PATENT DOCUMENTS

KR    20150056307 A    5/2015
KR    20160137323 A    11/2016
(Continued)

*Primary Examiner* — Zandra V Smith
*Assistant Examiner* — John M Parker
(74) *Attorney, Agent, or Firm* — Slater Matsil, LLP

(57) ABSTRACT

A method includes forming a semiconductor capping layer over a first fin in a first region of a substrate, forming a dielectric layer over the semiconductor capping layer, and forming an insulation material over the dielectric layer, an upper surface of the insulation material extending further away from the substrate than an upper surface of the first fin. The method further includes recessing the insulation material to expose a top portion of the first fin, and forming a gate structure over the top portion of the first fin.

20 Claims, 25 Drawing Sheets

US 10,964,548 B2
Page 2

Related U.S. Application Data

(60) Provisional application No. 62/552,986, filed on Aug. 31, 2017.

(51) Int. Cl.
*H01L 21/8238* (2006.01)
*H01L 29/06* (2006.01)
*H01L 21/02* (2006.01)
*H01L 29/66* (2006.01)
*H01L 21/762* (2006.01)
*H01L 29/08* (2006.01)

(52) U.S. Cl.
CPC ............ *H01L 21/823821* (2013.01); *H01L 21/823828* (2013.01); *H01L 21/823878* (2013.01); *H01L 29/0649* (2013.01); *H01L 29/0847* (2013.01); *H01L 29/66545* (2013.01); *H01L 29/7851* (2013.01); *H01L 29/7853* (2013.01); *H01L 21/31053* (2013.01); *H01L 21/823842* (2013.01)

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,276,062 B2 | 3/2016 | Peng et al. | |
| 9,330,982 B1 | 5/2016 | Cao et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2004/0009636 A1 | 1/2004 | Ichinose et al. | |
| 2008/0093669 A1 | 4/2008 | Iwamatsu | |
| 2010/0141630 A1 | 6/2010 | Kimura | |
| 2011/0097889 A1 | 4/2011 | Yuan et al. | |
| 2011/0140229 A1 | 6/2011 | Rachmady et al. | |
| 2011/0198696 A1 | 8/2011 | Choi et al. | |
| 2013/0248984 A1 | 9/2013 | Kim et al. | |
| 2014/0361314 A1 | 12/2014 | Cheng et al. | |
| 2014/0367795 A1 | 12/2014 | Cai et al. | |
| 2015/0102386 A1* | 4/2015 | Chen | H01L 23/3171 257/192 |
| 2015/0104923 A1 | 4/2015 | Tsai et al. | |
| 2015/0137263 A1 | 5/2015 | Lee et al. | |
| 2016/0035827 A1 | 2/2016 | Diaz et al. | |
| 2016/0056156 A1 | 2/2016 | Ghani et al. | |
| 2016/0163700 A1 | 6/2016 | Peng et al. | |
| 2016/0284706 A1* | 9/2016 | Chung | H01L 27/0924 |
| 2016/0343605 A1* | 11/2016 | Kelly | H01L 29/66795 |
| 2017/0053825 A1 | 2/2017 | Seo et al. | |
| 2017/0250106 A1 | 8/2017 | Lin et al. | |
| 2018/0019316 A1* | 1/2018 | Cheng | H01L 21/823418 |
| 2018/0151688 A1 | 5/2018 | Ching et al. | |

FOREIGN PATENT DOCUMENTS

| | | |
|---|---|---|
| TW | 201434108 A | 9/2014 |
| TW | 201709343 A | 3/2017 |
| TW | 201727918 A | 8/2017 |
| WO | 2016200402 A1 | 12/2016 |

\* cited by examiner

FIN FIELD-EFFECT TRANSISTOR DEVICE AND METHOD

PRIORITY CLAIM AND CROSS-REFERENCE

This application is a divisional of U.S. application Ser. No. 15/801,194, filed on Nov. 1, 2017, entitled "Fin Field-Effect Transistor Device and Method," which claims priority to U.S. Provisional Application No. 62/552,986, filed Aug. 31, 2017, entitled "Fin Field-Effect Transistor Device and Method," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-13, 14A, 14B, 14C, 15-2C, 21A, and 21B illustrate cross-sectional views of a FinFET device at various stages of fabrication, in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming liner layers over semiconductor fins to prevent or reduce the oxidization of the semiconductor fins during thermal anneal processes. However, one skilled in the art will readily appreciate that the methods disclosed in the present disclosure may be used in other devices or applications, e.g., planar devices.

Figure 1:
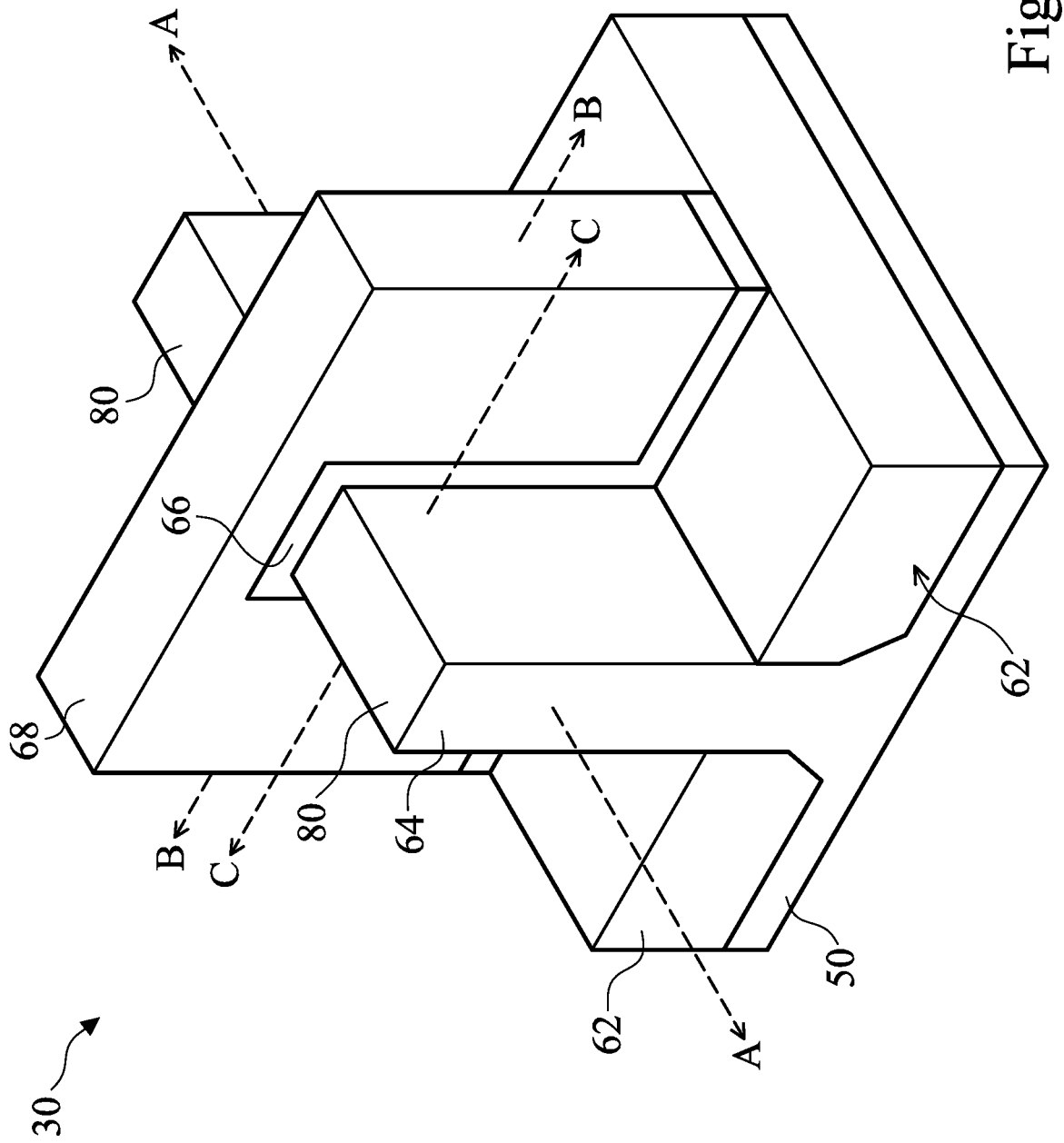
FIG. 1 illustrates a perspective view of a Fin Field-Effect Transistor (FinFET), in accordance with some embodiments.

FIG. 1 illustrates an example of a FinFET 30 in a perspective view. The FinFET 30 includes a substrate 50 having a fin 64. The fin 64 protrudes above neighboring isolation regions 62 disposed on opposing sides of the fin 64. A gate dielectric 66 is along sidewalls and over a top surface of the fin 64, and a gate electrode 68 is over the gate dielectric 66. Source/drain regions 80 are in the fin on opposite sides of the gate dielectric 66 and gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

Figure 13:
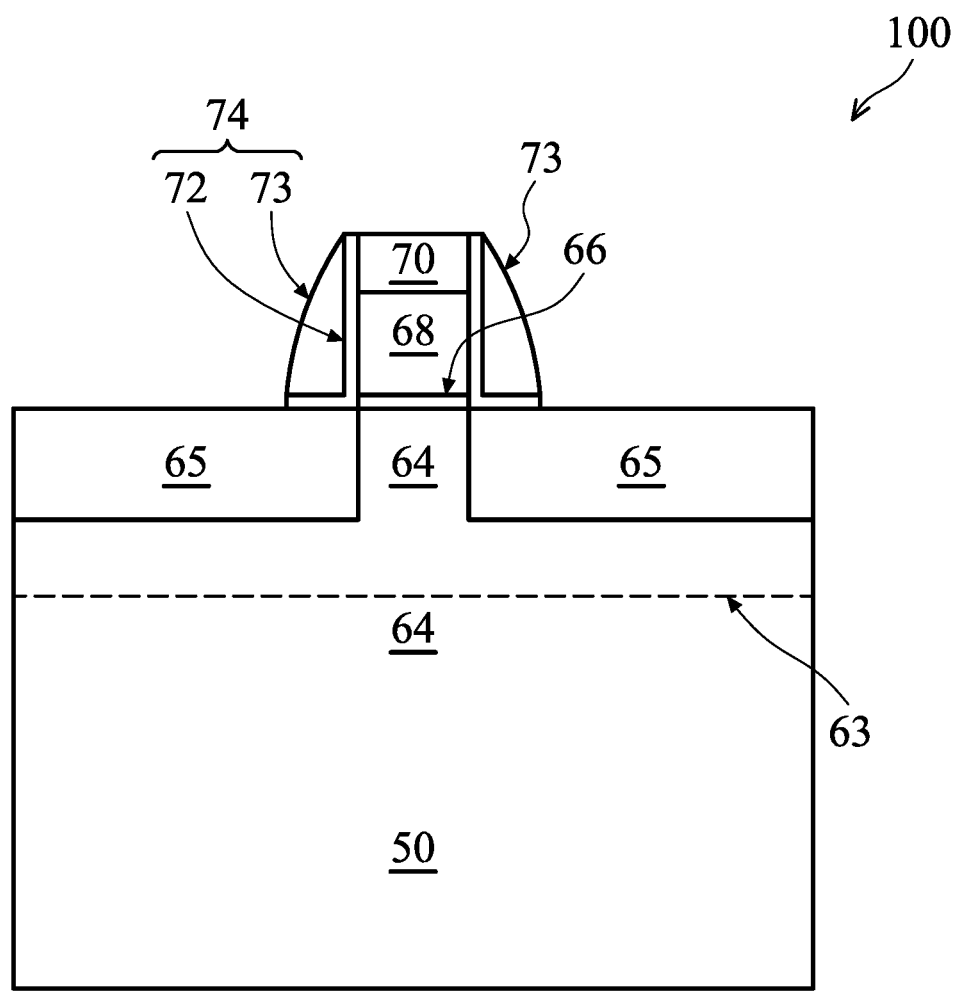
Figure 14A:
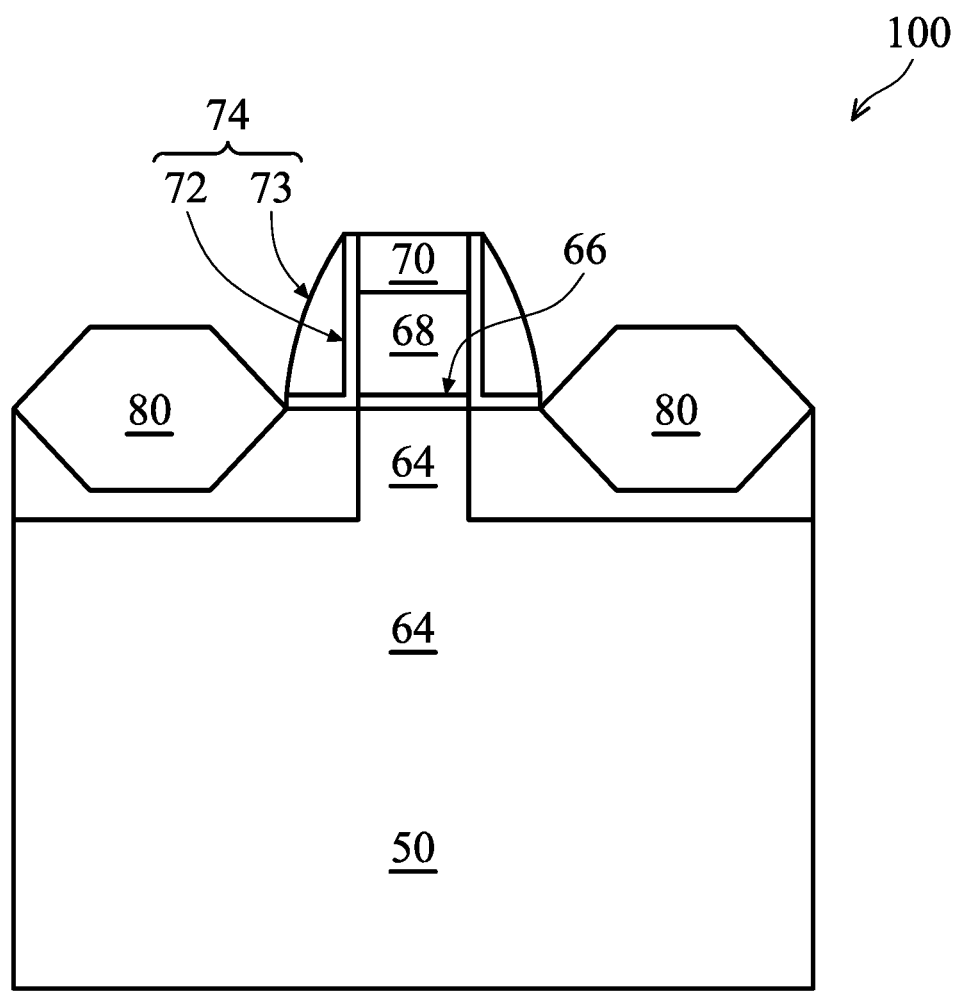
Figure 14B:
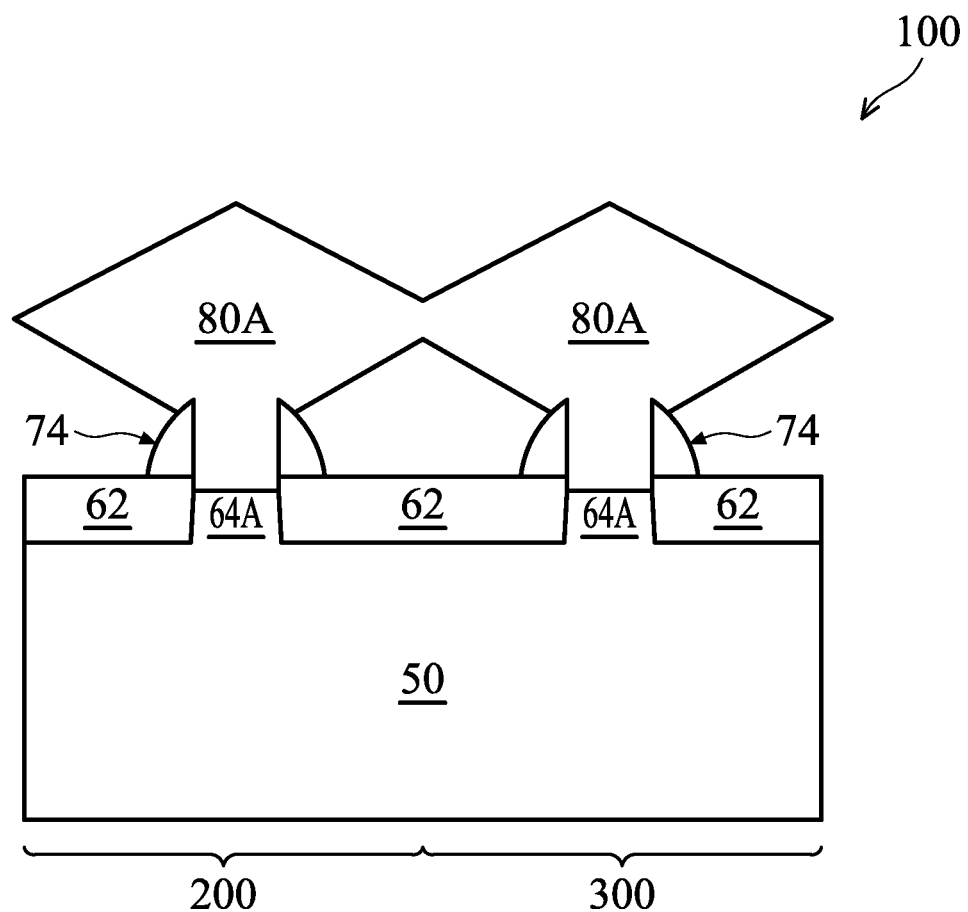
Figure 14C:
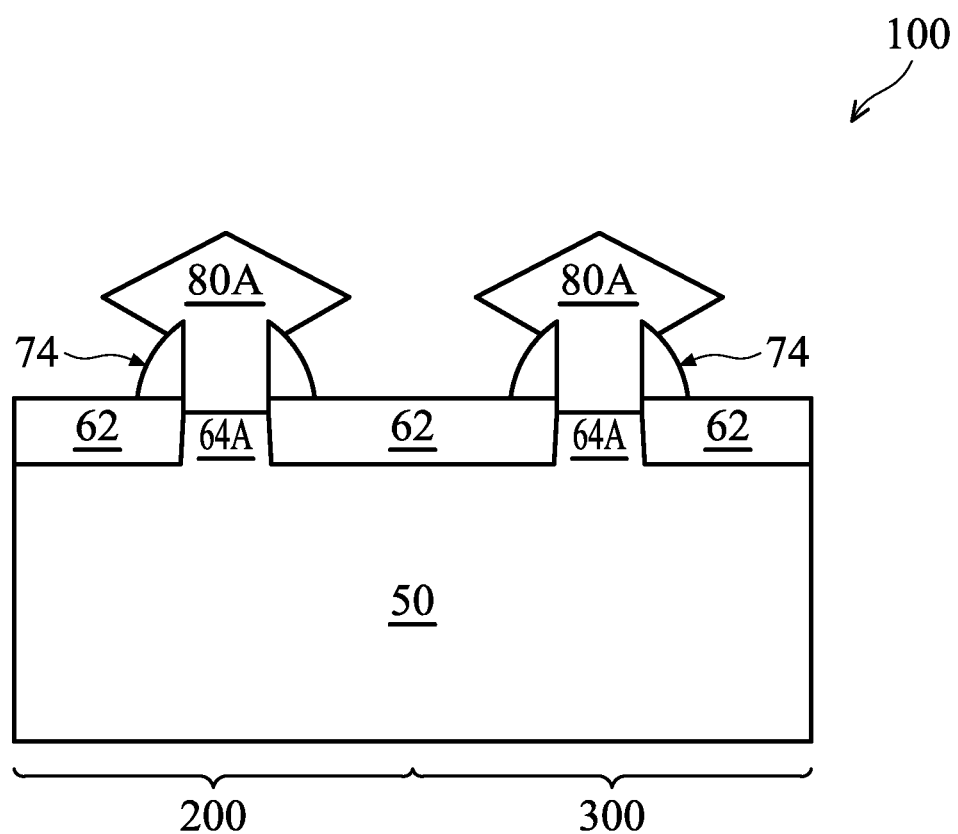

FIGS. 2-13, 14A, 14B, 14C, 15-20, 21A and 21B are cross-sectional views of a FinFET device 100 at various stages of fabrication in accordance with some embodiments. The FinFET device 100 is similar to the FinFET 30 in FIG. 1, except for multiple fins. FIGS. 2-12 illustrate cross-section views of the FinFET device 100 along cross-section B-B, FIGS. 13 and 14A illustrate cross-section views of the FinFET device 100 along cross-section A-A, FIGS. 14B and 14C illustrate cross-section views of the FinFET device 100 along cross-section C-C, FIGS. 15-20 and 21A illustrate cross-section views of the FinFET device 100 along cross-section A-A, and FIG. 21B illustrates a cross-section view of the FinFET device 100 along cross-section B-B.

Figure 2:
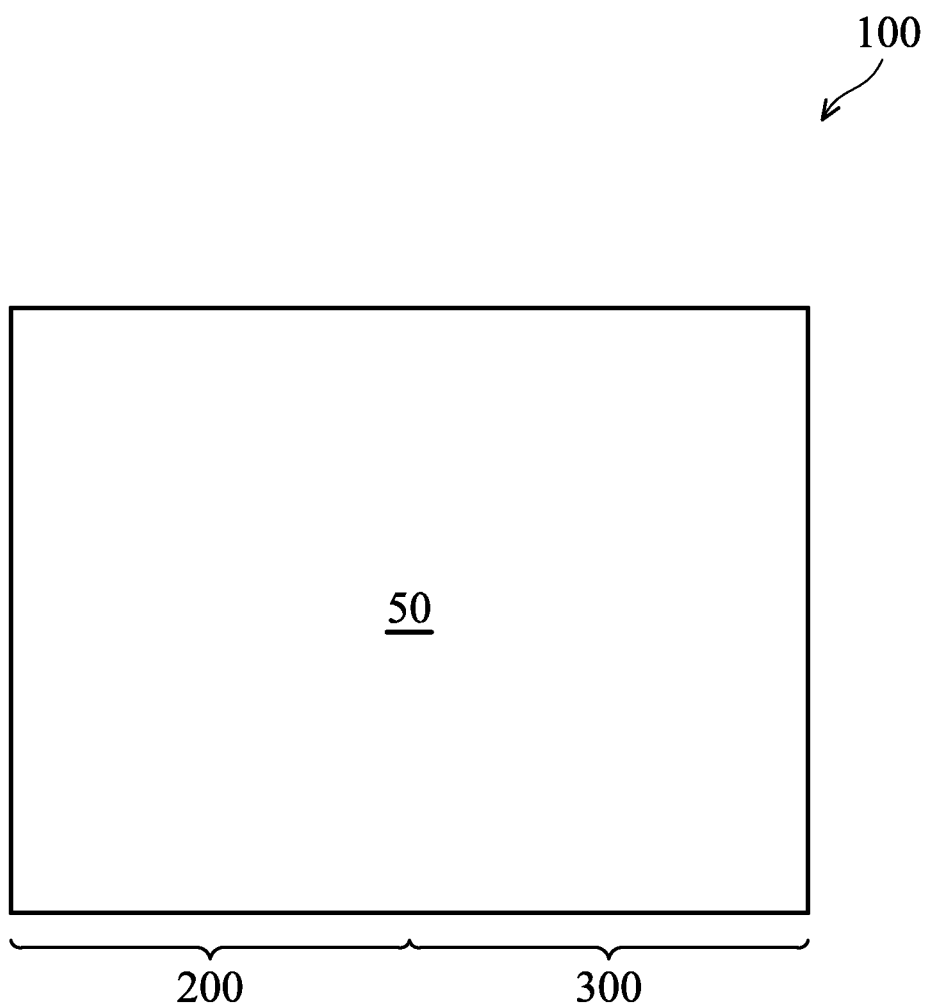

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2, the substrate includes a first portion in region 200, and a second portion in region 300. The first portion of the substrate 50 in region 200 may be used to form P-type devices such as P-type metal-oxide-semiconductor field-effect transistors (MOSFETs), and the second portion of the substrate 50 in region 300 may be used to form N-type devices such as N-type MOSFETs. Therefore, the region 200 may be referred to as a PMOS region, and the region 300 may be referred to as an NMOS region. In some embodiments, P-type devices (or N-type devices) are formed in both region 200 and region 300.

Figure 3:
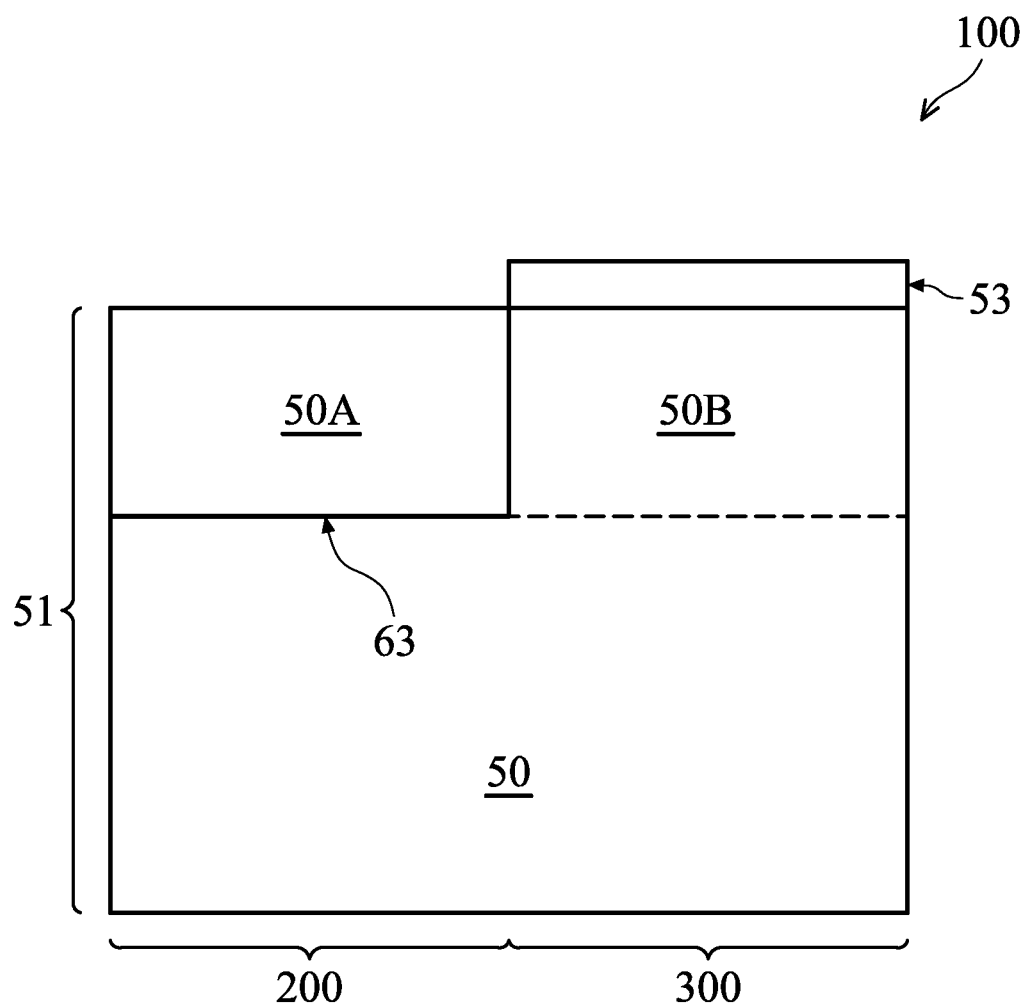

Next, referring to FIG. 3, a portion of the substrate 50 in the region 200 is replaced with a semiconductor material 50A, such as an epitaxial semiconductor material that is suitable for forming a corresponding type of device (e.g., P-type device) in the region 200. For example, the semiconductor material 50A may be or comprise epitaxially grown silicon germanium. To form the semiconductor material 50A, a mask layer 53, which may be a photo-sensitive layer such as photoresist, is formed over the substrate 50 using chemical vapor deposition (CVD), physical vapor deposition (PVD), spin coating, or other suitable deposition method. The mask layer 53 is then patterned using, e.g., photolithography and patterning techniques. The patterned mask layer 53 covers the region 300 but exposes the region 200, as illustrated in FIG. 3. An exposed portion of the substrate 50 in the region 200 is then removed by a suitable etching process, such as reactive ion etch (RIE), neutral beam etch (NBE), the like, or a combination thereof, to form a recess (not shown) in the region 200.

Next, an epitaxy is performed to grow the semiconductor material 50A in the recesses in the region 200. The epitaxially grown semiconductor material 50A may be in situ doped during growth, which may obviate the need for prior and subsequent implantations although in situ and implantation doping may be used together. After the epitaxy, the mask layer 53 may be removed by a suitable removal process, such as etching or plasma ashing. A planarization process, such as chemical mechanical polish (CMP), may then be performed to level the top surface of the semiconductor material 50A with the top surface of the substrate 50. FIG. 3 also shows an interface 63 between the semiconductor material 50A and the substrate 50, which may or may not be a straight line as illustrated in FIG. 3.

Optionally, another patterned mask layer (not shown) may be formed to cover the region 200 while exposing the region 300, and an exposed portion of substrate 50 in the region 300 may be removed and replaced with an epitaxial grown semiconductor material 50B, which is illustrated in phantom in FIG. 3. The semiconductor material 50B may be or comprise an epitaxial semiconductor material that is suitable for forming a corresponding type of device (e.g., N-type device) in the region 300. For example, the semiconductor material 50B may be or comprise epitaxially grown silicon carbide.

In some embodiments, the FinFET device 100 to be formed is a logic device, the PMOS region (e.g., region 200) has its top portion replaced by the semiconductor material 50A (e.g., silicon germanium), and the NMOS region (e.g., region 300) does not have its top portion replaced by the semiconductor material 50B, thus the NMOS region (e.g., region 300) has a same material (e.g., silicon) as the substrate 50. In another embodiment, the FinFET device 100 to be formed is a high power device, in which case the PMOS region (e.g., region 200) and the NMOS region (e.g., region 300) have their top portions replaced by a same semiconductor material silicon carbide (e.g., 50A and 50B are silicon carbide).

In other embodiments, the semiconductor material 50B (e.g., an epitaxial semiconductor material) replaces a portion of the substrate 50 in the region 300, and a portion of the substrate 50 in the region 200 may optionally be replaced by the semiconductor material 50A (e.g., an epitaxial semiconductor material). In yet other embodiments, the above described epitaxial semiconductor materials (e.g., 50A and 50B) are not formed, thus the processing illustrated in FIG. 3 may be omitted. The discussion below use an embodiment configuration for the substrate 50 where the semiconductor material 50A is formed in the first region 200 and the semiconductor material 50B is not formed in the region 300, with the understanding that the processing illustrated in FIGS. 4-21B may also be applied to other substrate configurations described above. In the discussion hereinafter, substrate 51 is used to refer to substrate 50 and the semiconductor materials 50A/50B, if formed.

The semiconductor materials 50A and 50B (e.g., epitaxial semiconductor materials) may have a lattice constant(s) greater than, substantially equal to, or smaller than, the lattice constant of substrate 50. The lattice constant(s) of the semiconductor materials 50A and 50B is determined by the material(s) selected by the conductivity types (e.g., N-type or P-type) of the resulting FinFETs. Further, it may be advantageous to epitaxially grow a material in an NMOS region different from the material in a PMOS region. In various embodiments, the semiconductor materials (e.g., 50A, 50B) may comprise silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 4:
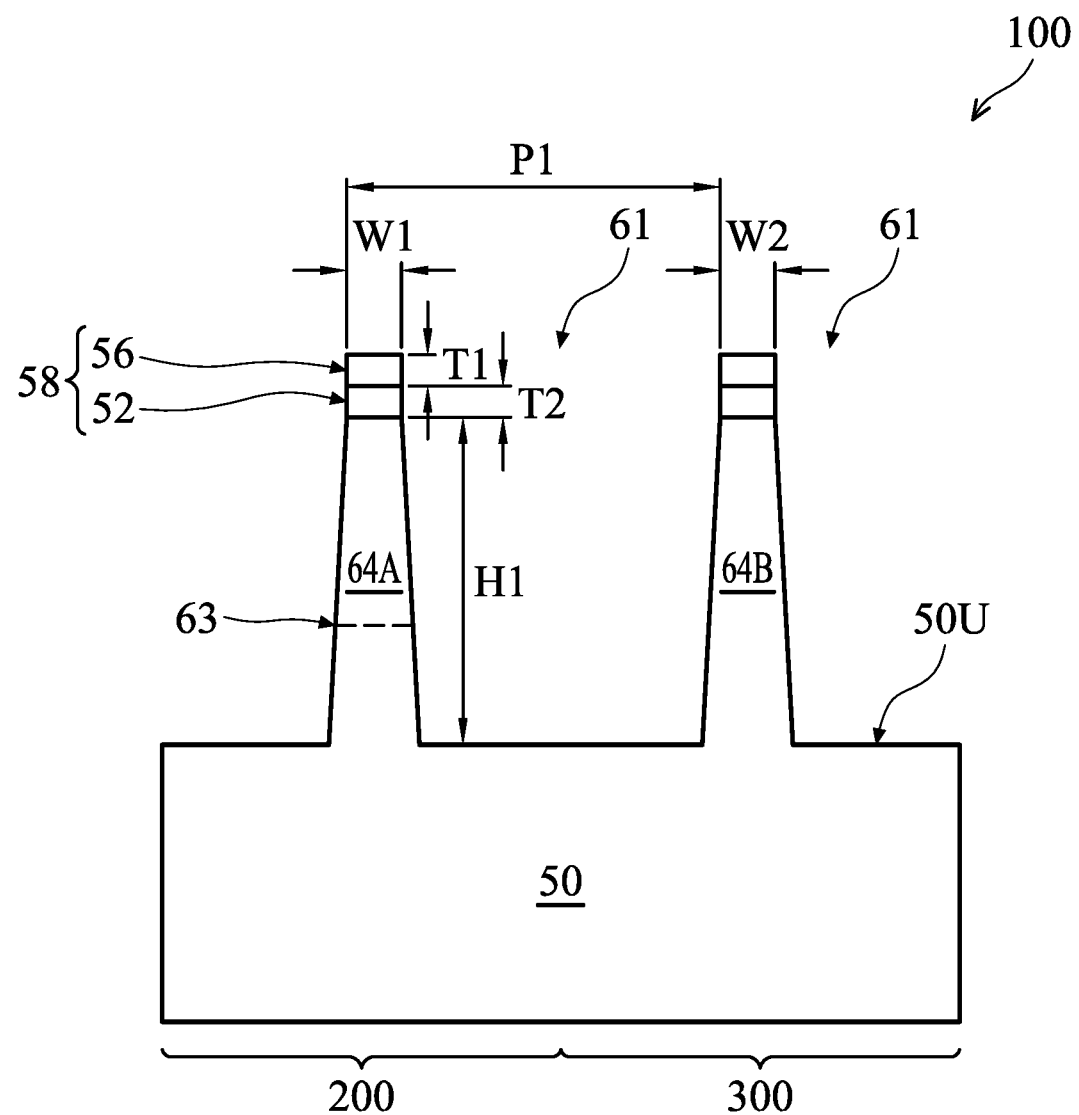

Next, referring to FIG. 4, the substrate 51 is patterned using, e.g., photolithography and etching techniques. For example, a mask layer, such as a pad oxide layer (not shown) and an overlying pad nitride layer (not shown), is formed over the substrate 51. The pad oxide layer may be a thin film comprising silicon oxide formed, for example, using a thermal oxidation process. The pad oxide layer may act as an adhesion layer between the substrate 51 and the overlying pad nitride layer. In some embodiments, the pad nitride layer is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer and pad nitride to form a patterned mask 58. As illustrated in FIG. 4, the patterned mask 58 includes patterned pad oxide 52 and patterned pad nitride 56.

The patterned mask 58 is subsequently used to pattern exposed portions of the substrate 51 to form trenches 61, thereby defining semiconductor fins 64 (also referred to as fins) between adjacent trenches as illustrated in FIG. 4. In some embodiments, the semiconductor fins 64 (e.g., 64A and 64B) are formed by etching trenches in the substrate 51 using, for example, reactive ion etch (RIE), neutral beam etch (NBE), the like, or a combination thereof. The etch may be anisotropic. In some embodiments, the trenches may be strips (viewed from the top) parallel to each other, and closely spaced with respect to each other. In some embodiments, the trenches may be continuous and surround the semiconductor fins 64.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

As illustrated in FIG. 4, a fin 64A is formed in the first region 200, and a fin 64B is formed in the second region 300. Recall that a top portion of the substrate 50 in the region 200 is replaced by a semiconductor material 50A. Therefore, a portion (e.g., the top half) of the fin 64A above the interface 63 between the semiconductor material 50A and the substrate 50 is formed of the semiconductor material 50A, and a portion (e.g., the bottom half) of the fin 64A below the interface 63 is formed of the material of the substrate 50. The fin 64B is formed entirely of the material of the substrate 50, in the illustrated example. In an exemplary embodiment, the portion of fin 64A above the interface 63 is formed of silicon germanium (e.g., SiGe), the portion of fin 64A below the interface 63 is formed of silicon (Si), and the fin 64B is formed of silicon (Si).

The example of FIG. 4 illustrates the case where bottoms of the trenches 61 extend below the interface 63. In other embodiments, the bottoms of the trenches 61 extend above or at the interface 63, in which case the fin 64A is formed entirely of the semiconductor material 50A, and the fin 64B is formed entirely of the material of the substrate 50. Although FIG. 4 illustrates one fin 64A in the region 200 and one fin 64B in the region 300, more than one fins may be formed in the region 200 and/or the region 300. These and other variations are fully intended to be included within the scope of the present disclosure. For simplicity, the interface 63 may not be illustrated in all subsequent figures.

In some embodiments, a thickness $T_1$ of the patterned pad nitride 56 is in a range from about 18.5 nm to about 21.5 nm, and a thickness $T_2$ of the patterned pad oxide 52 is in a range from about 1.5 nm to about 2.5 nm. A fin height $H_1$, measured between a top surface of the fin 64 and an upper surface 50U of the substrate 50 proximate the fin 64, may be in a range from about 109.5 nm to about 117.5 nm. A fin width $W_1$ (e.g., measured at the top surface of the fin) of the fin 64A is in a range from about 8.8 nm to about 12.4 nm, and a fin width $W_2$ (e.g., measured at the top surface of the fin) of the fin 64B is in a range from about 8.9 nm to about 13.1 nm, in some embodiments. A pitch $P_1$ between two adjacent fins 64A and 64B is in a range from about 24.5 nm to about 27.5 nm, in the illustrated embodiment.

Figure 5:
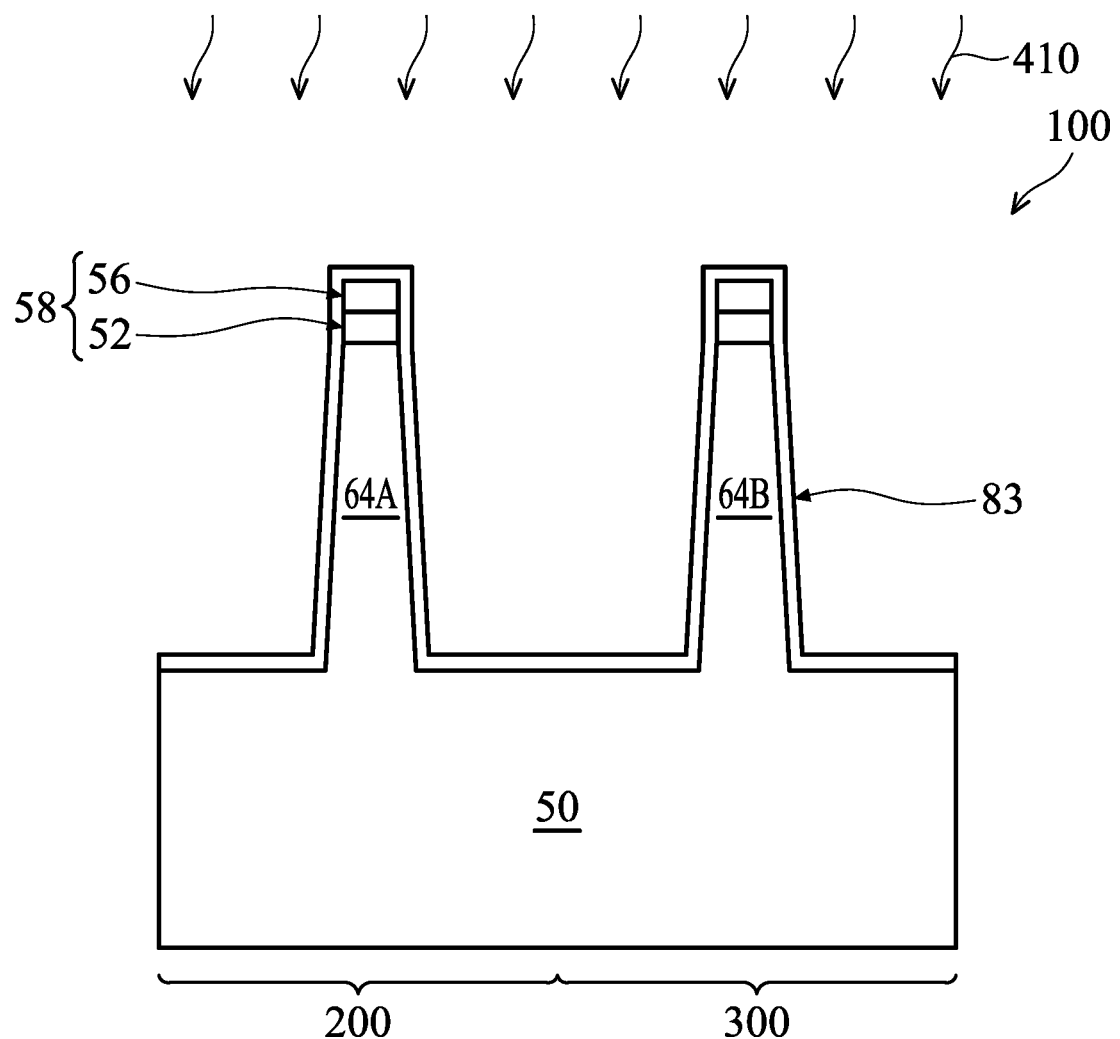

Referring now to FIG. 5, a capping layer 83 is formed conformally over the substrate 50 and over the fins 64. The capping layer 83 is a semiconductor capping layer such as a silicon capping layer (e.g., a layer of silicon), in some embodiments. Therefore, the capping layer 83 may also be referred to as a silicon liner. Any suitable deposition method, such as CVD, PVD, atomic layer deposition (ALD), the like, or combinations thereof, may be used to form the capping layer 83. Besides silicon, other suitable material, such as silicon oxide, silicon nitride, combinations therefore, or multiple layers thereof, may also be used for the capping layer 83. The discussion below may refer to the capping layer 83 as a silicon capping layer or silicon liner, with the understanding that besides silicon, other suitable material may also be used for the capping layer 83.

In accordance with an embodiment, the capping layer 83 is a silicon capping layer, and is formed by CVD using a silicon-containing precursor such as disilane (e.g., $Si_2H_6$) and a carrier gas such as hydrogen (e.g., $H_2$). A flow rate for $Si_2H_6$ is in a range from about 160 standard cubic centimeter per minute (sccm) to about 200 sccm, and a flow rate for $H_2$ is in a range from about 2 standard liter per minute (slm) to about 5 slm, in some embodiments. A pressure of the deposition process is in a range from about 580 torr to about 690 torr, in some embodiments. In some embodiments, a thickness of the capping layer 83 formed is in a range from about 1.3 nm to about 1.6 nm.

After the capping layer 83 is formed, a nitridation treatment 410 is performed for the capping layer 83. The nitridation treatment 410 is performed using a nitride-containing gas, such as ammonia (e.g., $NH_3$), in some embodiments. The nitridation treatment 410 converts a top layer (e.g., the exterior portion) of the capping layer 83 into a nitride (e.g., silicon nitride), which nitride may prevent or reduce oxidation of the fins 64.

In some embodiments, the nitridation treatment 410 is performed with a flow rate for $NH_3$ in a range from about 2.5 slm to about 4 slm. A temperature of the nitridation treatment 410 may be in a range from about 680° C. to about 750° C. A pressure of the nitridation treatment 410 may be in a range from about 4.6 torr to about 5.2 torr. The nitridation treatment 410 may be performed for a duration between about 30 seconds to about 120 seconds.

After the nitridation treatment, the exterior portion of the capping layer 83, which exterior portion may comprise, e.g., about 2% to about 3% of the total thickness of the capping layer 83, is converted into a nitride (e.g., a silicon nitride, not separately illustrated in FIG. 5). In an exemplary embodiment, the capping layer 83 is a silicon capping layer, and a top layer (e.g., the top 2% 3% in thickness) of the capping layer 83 is converted into silicon nitride by the nitridation treatment 410. The silicon nitride forms a protective thin film that prevents or reduces the oxidization of the fins 64.

As the sizes (e.g., $W_1$ and $W_2$ in FIG. 4) of the fins 64 continue to shrink in advanced processing technologies, the fins 64 have a higher risk of collapsing during subsequent processing. The capping layer 83 provides structural support for the fins 64 to prevent collapse of the fins 64 in subsequent processing. In addition, the nitride film formed by the nitridation treatment 410, together with other features of the present disclosure disclosed hereinafter, prevent or reduce the oxidization of the fins 64, thereby helping to reduce fin loss due to oxidization and maintain the size of the fins 64.

Figure 6:
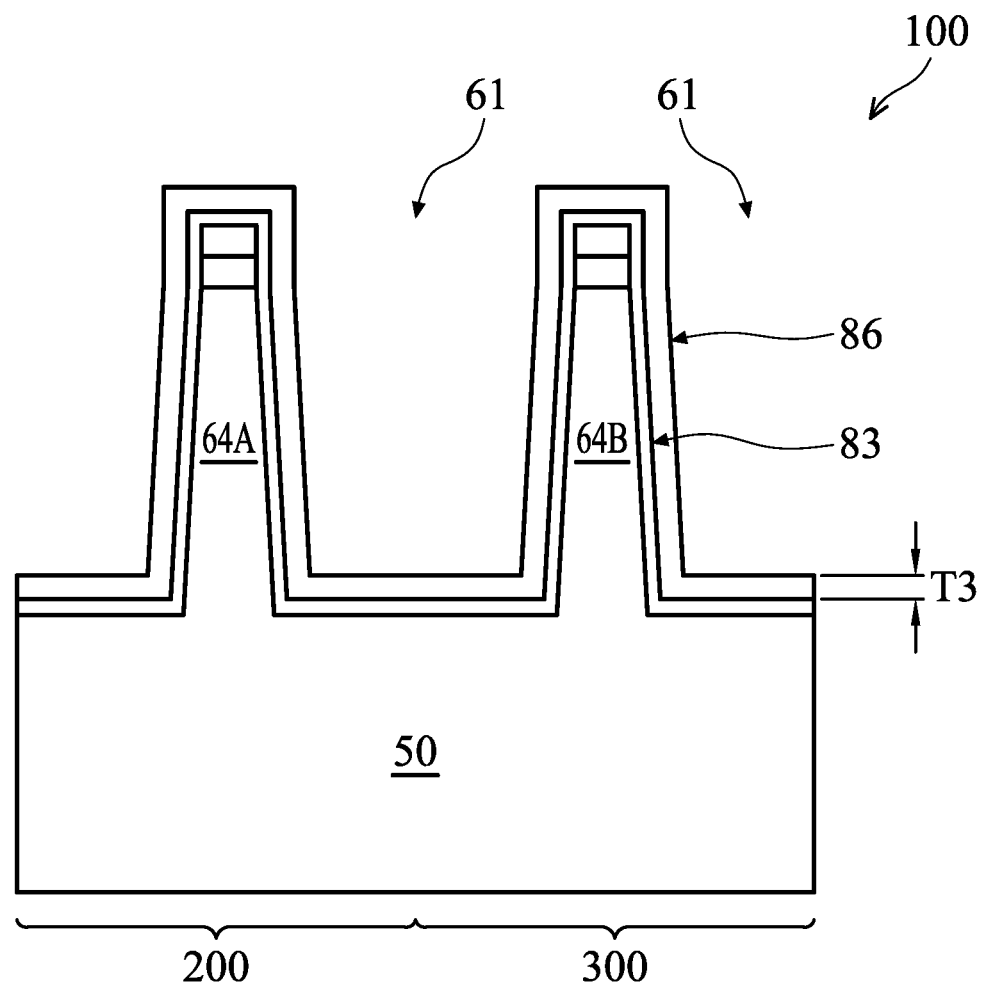

Referring next to FIG. 6, a dielectric layer 86 is conformally formed over the capping layer 83. The dielectric layer 86 may comprise suitable dielectric material that reduces or prevents oxidization of the fins 64. For example, the dielectric layer 86 may be a silicon nitride (e.g., $SiN_x$), silicon oxynitride (e.g., SiON), or silicon oxide (e.g., $SiO_2$) layer formed by CVD, PVD, ALD, the like, or combinations thereof.

In an exemplary embodiment, the dielectric layer 86 is a silicon nitride layer, and is formed by ALD using dichlorosilane (e.g., $SiH_2Cl_2$) and ammonia (e.g., $NH_3$) as precursors. A flow rate for $SiH_2Cl_2$ is between about 1 slm and about 4 slm, and a flow rate for $NH_3$ is between about 5 slm and about 8 slm, in some embodiments. A temperature of the deposition process for the dielectric layer 86 may be between about 400° C. and about 600° C., and a pressure of the deposition process may be between about 2 torr and about 4 torr. After the deposition process is finished, a thickness $T_3$ of the dielectric layer 86 formed is in a range from about 2 nm to about 4 nm, in some embodiments.

Figure 7:
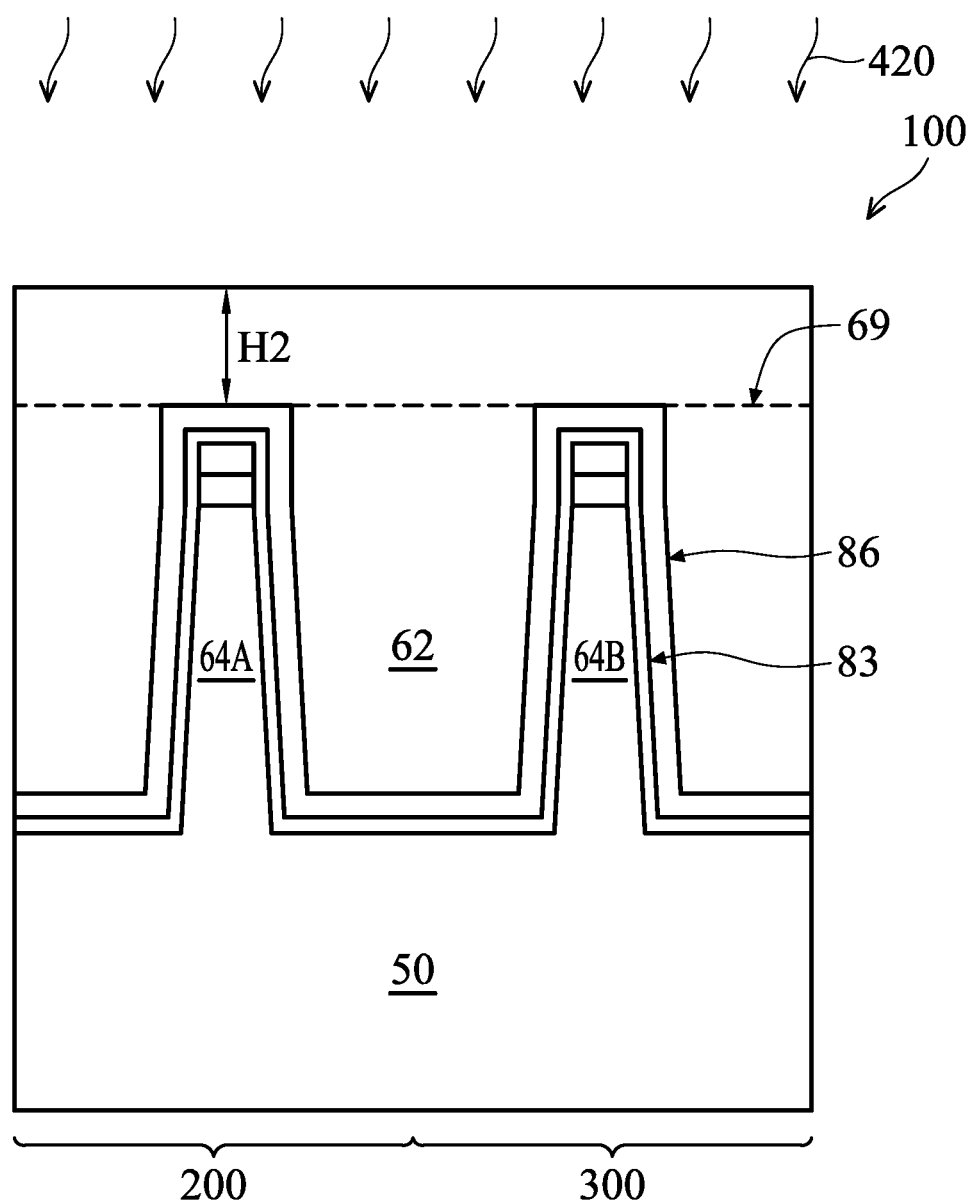

Next, as illustrated in FIG. 7, an insulation material 62 is formed to fill the trenches 61 (see FIG. 6). After the insulation material 62 is deposited, an anneal process 420 is performed to cure the deposited insulation material 62, in some embodiments. The insulation material 62 may be an oxide, such as silicon oxide, a nitride, the like, or a combination thereof, and may be formed by a high density plasma chemical vapor deposition (HDP-CVD), a flowable CVD (FCVD), the like, or a combination thereof. Other insulation materials and/or other formation processes may be used.

In an exemplary embodiment, the insulation material 62 comprises silicon oxide (e.g., $SiO_2$) and is formed by an FVCD process. As illustrated in FIG. 7, the deposited insulation material 62 fills the trenches 61 (see FIG. 6) and extends above the top surfaces of the fins 64. For example, a height $H_2$ of the insulation material 62 over the top surfaces of the fins 64 is in a range from about 250 nm to about 350 nm.

Once the insulation material 62 is deposited, an anneal process 420 is performed to cure the deposited insulation material 62. In some embodiments, the anneal process 420 comprises a first anneal process followed by a second anneal process. The first anneal process is a wet anneal, such as a wet steam anneal, and the second anneal process is a dry anneal, in some embodiments. In accordance with an embodiment, the first anneal is a wet steam anneal (e.g., a thermal anneal process performed in an environment comprising water steam) performed at a temperature in a range from about 500° C. to about 700° C., for a duration of about two hours to about three hours. In accordance with an embodiment, the second anneal process is a dry anneal performed in an ambient comprising nitrogen (e.g., $N_2$ gas), at a temperature in a range from about 600° C. to about 800° C., for a duration of about one hour to about two hours.

Due to the thickness of the insulation material 62, the anneal process 420 may cure the top portions (e.g., portions above or proximate top surfaces of the fins 64) of the insulation material 62, and the bottom portions (e.g., portions below dashed line 69) of the insulation material 62 may not be cured sufficiently. A subsequent anneal process 430 (see FIG. 9) will further cure the insulation material 62.

Figure 8:
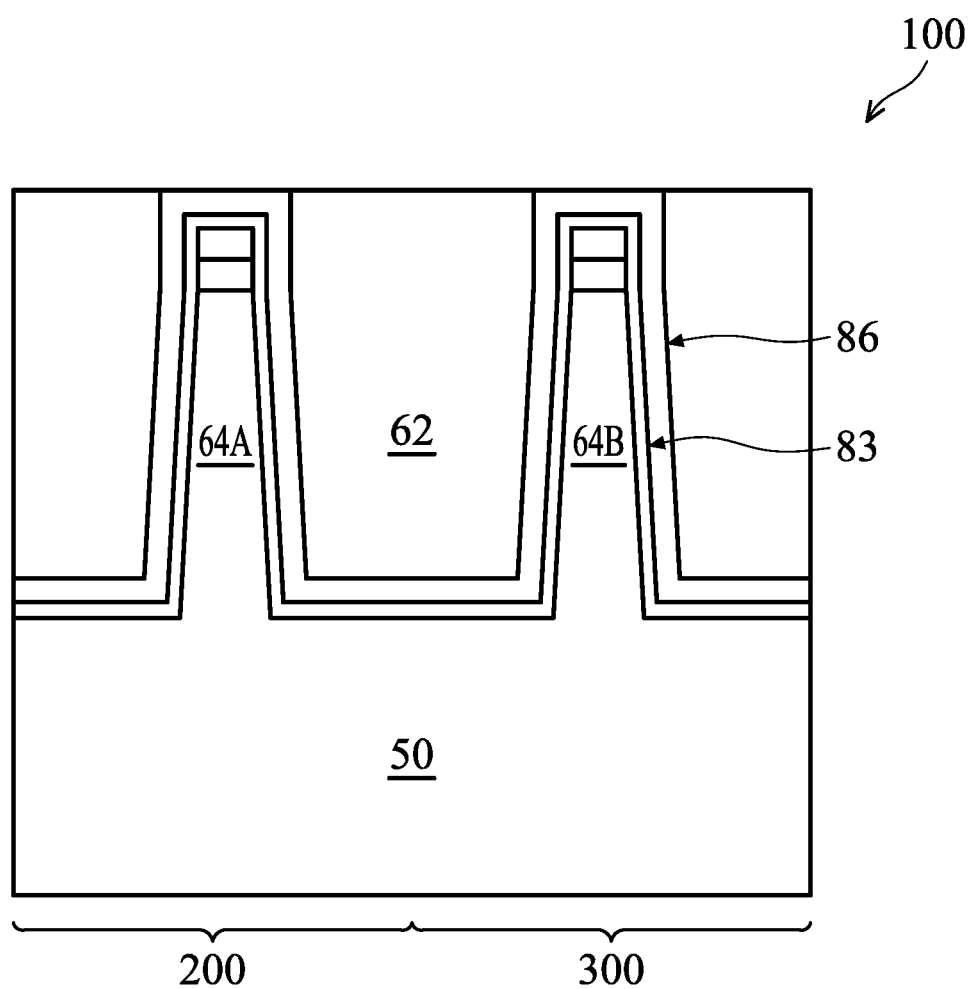

Next, referring to FIG. 8, a planarization process, such as CMP, may remove excess insulation material 62 and form a planar top surface of the insulation material 62. As illustrated in FIG. 8, the planarization process also exposes top surfaces of the dielectric layer 86.

Figure 9:
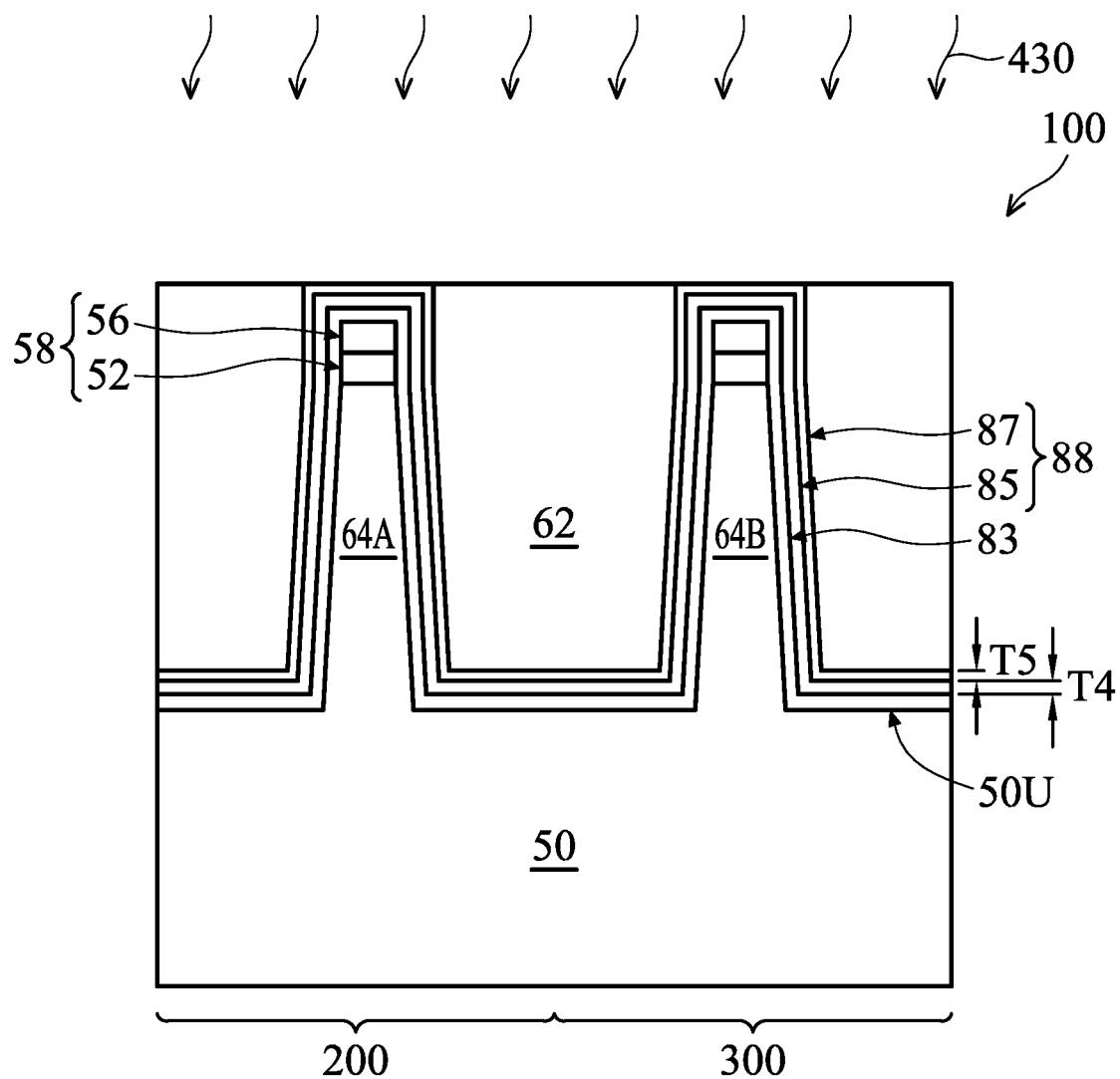

Referring to FIG. 9, after the planarization process, an anneal process 430 is performed to further cure the remaining portions of the insulation material 62. A top layer 87 (e.g., exterior portion) of the dielectric layer 86 (e.g., silicon nitride) is oxidized after the anneal process 430 and is converted into an oxide (e.g., silicon oxynitride) of the dielectric layer 86, in some embodiments. Remaining portions of the dielectric layer 86 are denoted as a dielectric layer 85, as illustrated in FIG. 9. More details are discussed hereinafter.

In some embodiments, the anneal process 430 comprises a first anneal process followed by a second anneal process. The first anneal process is a wet anneal, such as a wet steam anneal, and the second anneal process is a dry anneal, in some embodiments. In accordance with an embodiment, the first anneal process is a wet steam anneal performed at a temperature in a range from about 500° C. to about 700° C., for a duration of about two hours to about three hours. In accordance with an embodiment, the second anneal process is a dry anneal performed in an ambient comprising nitrogen (e.g., $N_2$ gas), at a temperature in a range from about 600° C. to about 800° C., for a duration of about one hour to about two hours. The anneal process 430 may be performed under the same conditions as the anneal process 420 in FIG. 7, in some embodiments.

In some embodiments, the top layer 87 (e.g., exterior portion) of the dielectric layer 86 is oxidized by, e.g., oxygen in the wet steam that diffuses into the insulation material 62, and is converted into an oxide of a material of the dielectric layer 86. In an exemplary embodiment, the dielectric layer 86 (see FIG. 8) comprises silicon nitride, the oxidized top layer 87 (e.g., a dielectric layer) comprises silicon oxynitride, and the dielectric layer 85 comprises silicon nitride. In the discussion below, the oxidized top layer 87 and the dielectric layer 85 may be collectively referred to as a dielectric liner stack 88.

In some embodiments, a thickness $T_5$ of the oxidized top layer 87 is about one third of the original thickness $T_3$ (see FIG. 6) of the dielectric layer 86. In other words, a ratio between the thickness of the oxidized top layer 87 and a thickness $T_4$ of the dielectric layer 85 is about 1:2.

In some embodiments, the oxygen that causes the (partial) oxidization of the dielectric layer 86 comes from the wet steam used during the anneal process, thus top portions of the dielectric layer 86, which are closer to the oxygen source, are oxidized more than bottom portions of the dielectric layer 86, which are further away from the oxygen source. For example, referring to FIG. 9, after the anneal process 430, a ratio (e.g., an atomic percentage ratio) between the elements silicon (e.g., Si), nitrogen (e.g., N), and oxygen (e.g., O), i.e., a ratio between Si:N:O, in a first portion of the dielectric liner stack 88 proximate the top surfaces of the fins 64 is about 5:2.5:2.5, in some embodiments. A ratio of Si:N:O in a second portion of the dielectric liner stack 88 proximate a mid-point of the fins 64 (e.g., a mid-point between the top surfaces of the fins 64 and the upper surface 50U of the substrate 50) is about 5:3:2, in some embodiments. A ratio of Si:N:O in a third portion of the dielectric liner stack 88 proximate the upper surface 50U of the substrate 50 is about 5:4:1, in some embodiments.

Although the oxidized top layer 87 is illustrated in FIG. 9 as being formed during and/or after the anneal process 430, the oxidized top layer 87 may be formed during and/or after the anneal process 420 as well. For example, when the height $H_2$ (see FIG. 7) of the insulation material 62 is small (e.g., 350 nm or smaller), oxygen from the steam wet anneal of the anneal process 420 may oxidize the dielectric layer 86 and form oxidized top layer 87. These and other variations are fully intended to be included within the scope of the present disclosure.

Due to the protection offered by, e.g., the dielectric liner stack 88 and the thin nitride film formed over the capping layer 83 by the nitridation treatment 410, the fins 64 are protected from the oxygen during the anneal processes (e.g., 420 and 430), and little or no oxidization of the fins 64 occurs. The presently disclosed method therefore avoids fin critical dimension loss due to oxidization of the fins 64.

Figure 10:
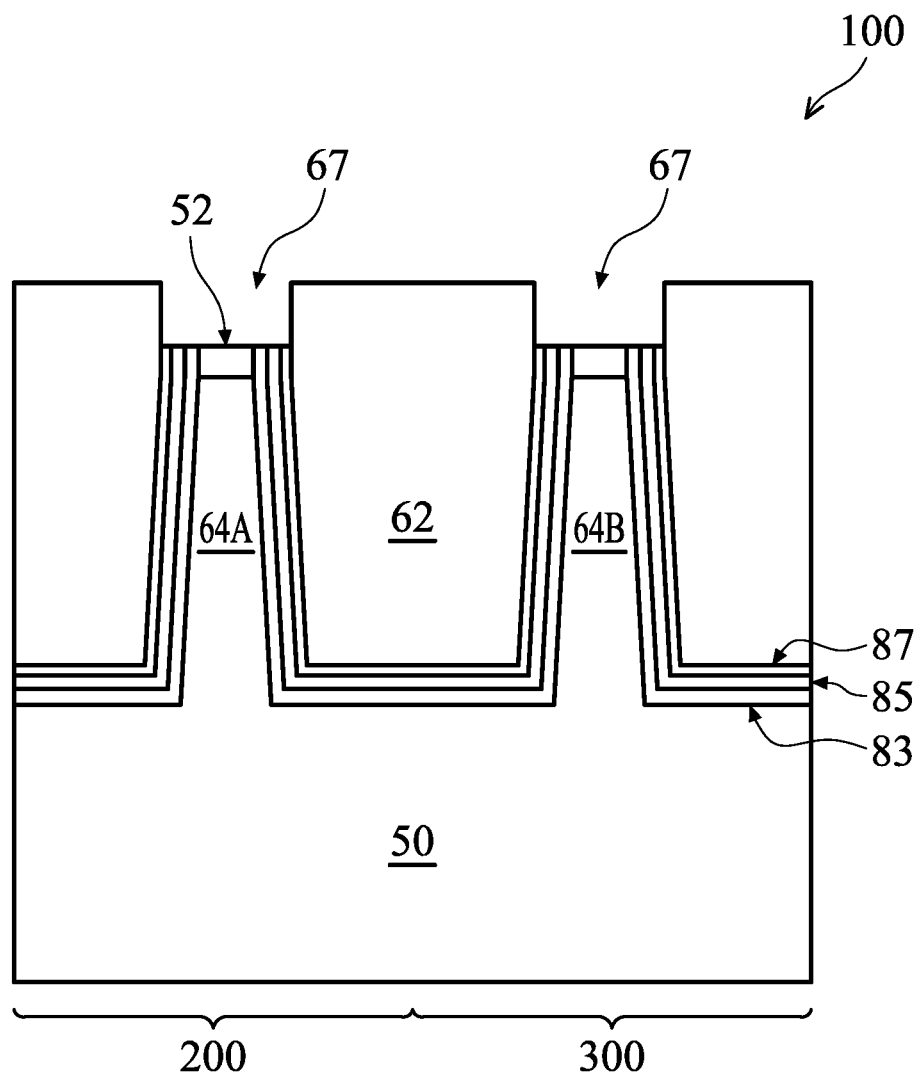

Next, as illustrated in FIG. 10, the patterned masks 56 (see FIG. 9) is removed using, e.g., a dry etch, although other suitable removal process may also be used. For example, a dry etch using phosphoric acid (e.g., $H_3PO_4$) may be performed to remove the patterned mask 56, and therefore, openings 67 are formed in the insulation material 62 exposing the top surfaces of the patterned masks 52. As illustrated in FIG. 10, the removal process also removes portions of the dielectric layer 85, portions of the oxidized top layer 87, and portions of the capping layer 83 that were disposed over the top surfaces of the fins 64.

Figure 11:
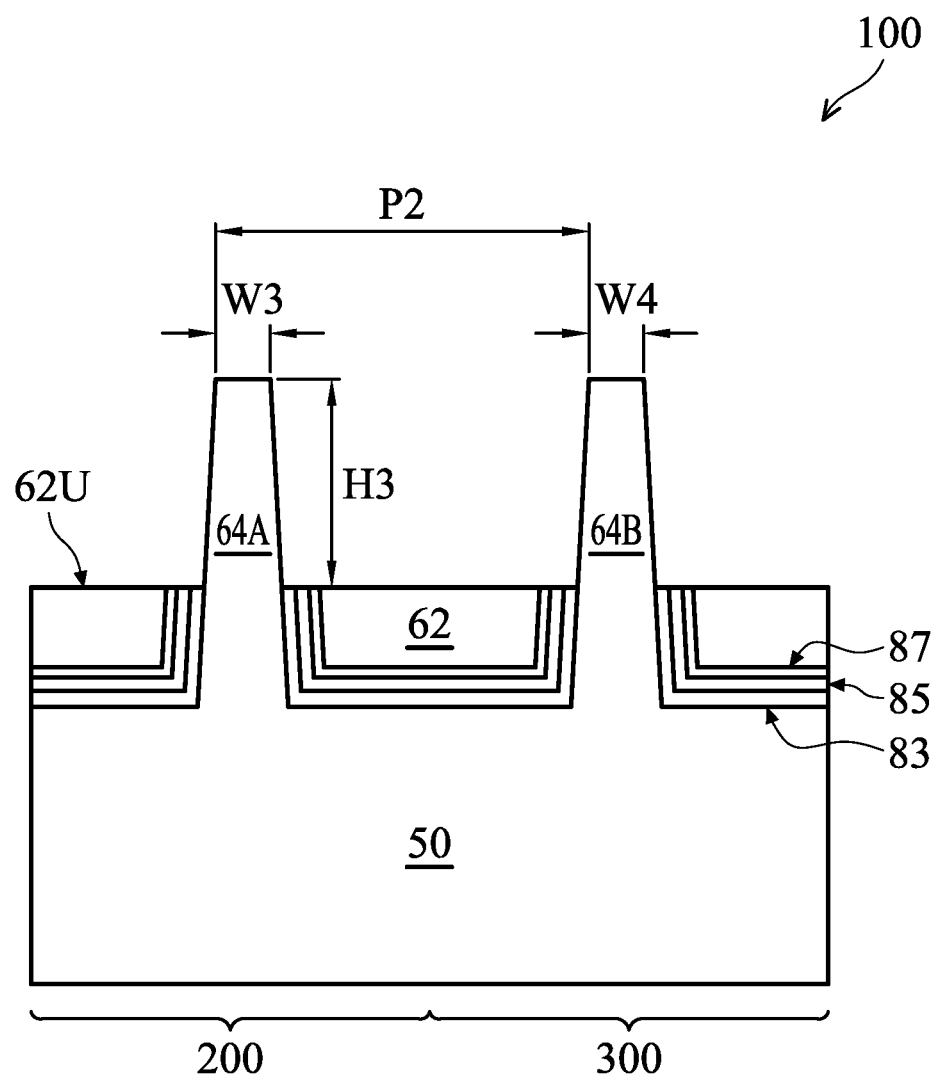

Next, in FIG. 11, the insulation material 62 is recessed such that upper portions of the fins 64 protrude above an upper surface 62U of the recessed insulation material 62. The recessing of the insulation material 62 also removes the patterned masks 52, portions of the dielectric layer 85, portions of the oxidized top layer 87, and portions of the capping layer 83 that are above the upper surface 62U of the recessed insulation material 62, as illustrated in FIG. 11. The recessed insulation material 62 forms isolation regions 62, such as shallow trench isolation (STI) regions, in some embodiments. The insulation material 62 may be recessed using a dry etch, and the dry etch may use an etching gas comprising ammonia (e.g., $NH_3$) and hydrogen fluoride (HF). Other suitable etching process may also be used to recess the insulation material 62.

The top surfaces 62U of the insulation material 62 may have a flat surface (as illustrated), a convex surface, a concave surface (such as dishing), or a combination thereof. The top surfaces 62U of the insulation material 62 may be formed flat, convex, and/or concave by an appropriate etch. The insulation material 62 may be recessed using an acceptable etching process, such as one that is selective to the material of the insulation material 62. For example, a chemical oxide removal using a CERTAS® etch or an Applied Materials SICONI tool or dilute hydrofluoric (dHF) acid may be used.

As illustrated in FIG. 11, a fin height $H_3$, measured between the top surface of the fins 64 and the top surface 62U proximate the fins 64, may be in a range between about 52.5 nm and about 55.5 nm. A fin width $W_3$ for the fin 64A (e.g., a fin comprising SiGe) is in a range from about 7.5 nm to about 11 nm, and a fin width $W_4$ for the fin 64B (e.g., a fin comprising silicon) is in a range from about 7 nm to about 13.7 nm, in some embodiments. A fin pitch $P_2$ between the fins 64A and the fin 64B, measured after the recessing of the insulation material 62, is between about 24.5 nm to about 27.5 nm. In some embodiments, the fin pitch $P_2$ is the same as the fin pitch $P_1$ (see FIG. 4).

Figure 12:
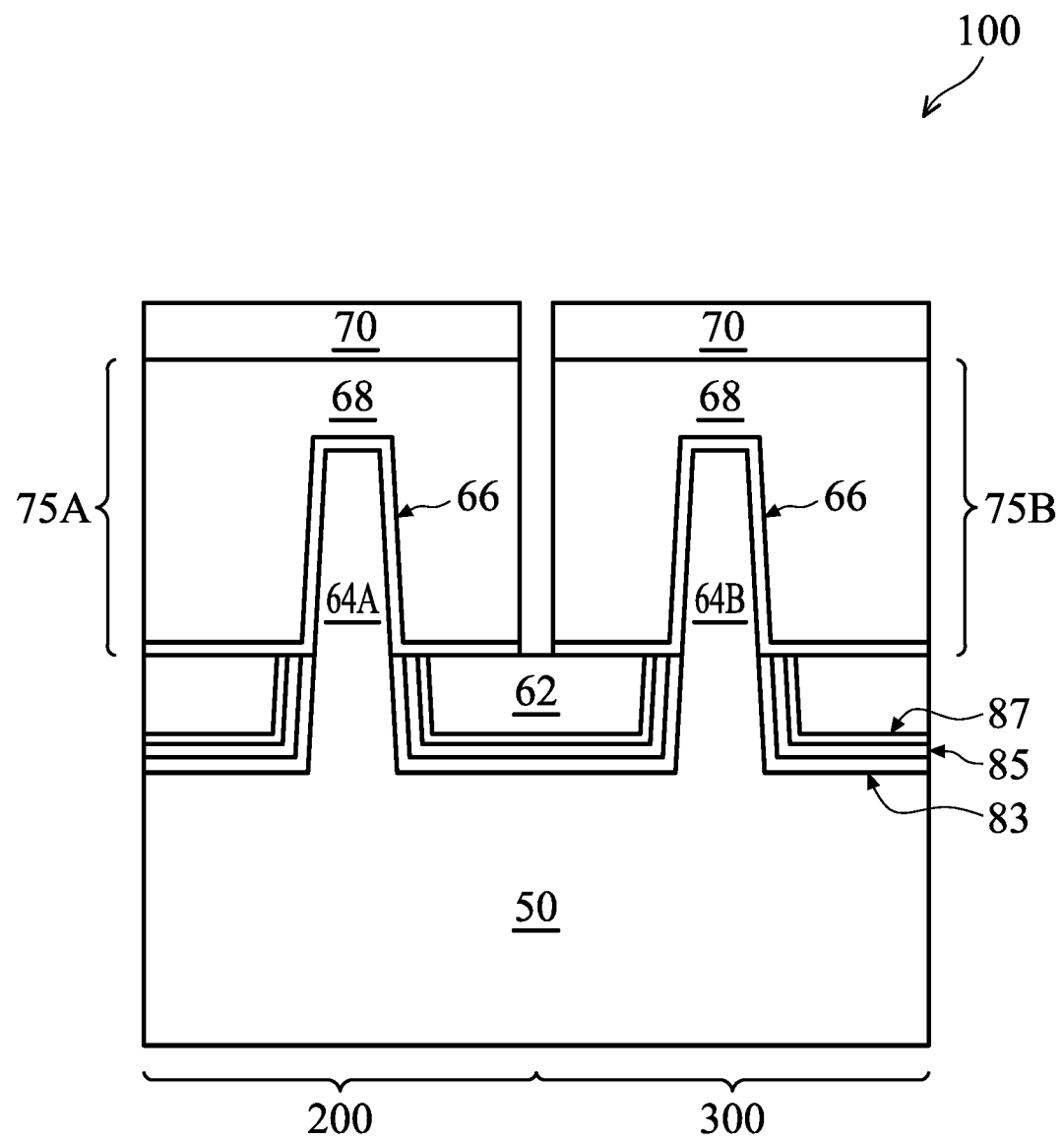

FIG. 12 illustrates the formation of dummy gate structures 75 (e.g., 75A and 75B) over the semiconductor fins 64 (e.g., 64A/64B). The dummy gate structures 75 includes gate dielectric 66 and gate 68, in some embodiments. A mask 70 may be formed over the dummy gate structure 75. To form the dummy gate structure 75, a dielectric layer is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, the dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multilayers thereof. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

FIGS. 13, 14A, 14B, 14C, 15-20, 21A, and 21B illustrate various cross-section views of further processing of the FinFET device 100. The processing as illustrated in FIGS. 13, 14A, 14B, 14C, 15-20, 21A, and 21B are performed for both the PMOS region 200 and the NMOS region 300, with some materials (e.g., dopants for source/drain regions, or work function layers of metal gates) adjusted to suit the type of devices (e.g., P-type devices or N-type devices) formed in the respective regions, in some embodiments. For simplicity, one cross-sectional view along cross-section A-A of a fin 64A or a fin 64B (instead of two cross-sectional views along cross-section A-A of a fin 64A and along cross-section A-A of a fin 64B), is shown in each of FIGS. 13, 14A, 15-20 and 21A.

As illustrated in FIG. 13, lightly doped drain (LDD) regions 65 are formed in the fins 64. The LDD regions 65 may be formed by a plasma doping process. The plasma doping process may implant N-type impurities (for N-type devices) or P-type impurities (for P-type devices) in the fins 64 to form the LDD regions 65. For example, a patterned mask layer may be formed to shield the PMOS region 200 while N-type impurities are implanted into the LDD regions 65 of the NMOS region 300. Similarly, another patterned mask layer may be formed to shield the NMOS region 300 while P-type impurities are implanted into the LDD regions 65 of the PMOS region 200. FIG. 13 also illustrates the interface 63 between the semiconductor material 50A and the substrate 50 (see FIGS. 3 and 4), which exists in the fin 64A and does not exist in the fin 64B, in the illustrated embodiment. For simplicity, the interface 63 may not be illustrated in all figures.

In some embodiments, the LDD regions 65 abut the channel region of the FinFET device 100. Portions of the LDD regions 65 may extend under gate 68 and into the channel region of the FinFET device 100. FIG. 13 illustrates a non-limiting example of the LDD regions 65. Other configurations, shapes, and formation methods of the LDD regions 65 are also possible and are fully intended to be included within the scope of the present disclosure. For example, LDD regions 65 may be formed after first gate spacers 72 are formed.

Still referring to FIG. 13, after the LDD regions 65 are formed, a gate spacer 74 is formed on the gate structure. The gate spacer 74 may include a first gate spacer 72 and a second gate spacer 73. In the example of FIG. 13, the first gate spacer 72 is formed on opposing sidewalls of the gate 68 and on opposing sidewalls of the gate dielectric 66. The first gate spacer 72 may also extend over the upper surface of the semiconductor fins 64 (with the LDD regions 65 formed within the fins 64) and the upper surface of the isolation regions 62. The second gate spacer 73 is formed on the first gate spacer 72, as illustrated in FIG. 13. The first gate spacer 72 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The second gate spacer 73 may be formed of silicon nitride, silicon carbonitride, a combination thereof, or the like using a suitable deposition method.

In an exemplary embodiment, the gate spacer 74 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of dummy gate structure 75) while keeping a second portion of the second gate spacer layer disposed along sidewalls of the dummy gate structure 75. The second portion of the second gate spacer layer remaining after the anisotropic etch process forms the second gate spacer 73. The anisotropic etch process also removes a portion of the first gate spacer layer disposed outside of the sidewalls of the second gate spacer 73, and the remaining portion of the first gate spacer layer forms the first gate spacer 72. The shapes and formation methods of the first gate spacer 72 and the second gate spacer 73 as illustrated in FIG. 13 are merely non-limiting examples, and other shapes and formation methods are also possible.

Next, as illustrated in FIG. 14A, source/drain regions 80 are formed. The source/drain regions 80 are formed by etching the LDD regions 65 within the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 14A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 14B). In some embodiments, the source/drain regions 80 for adjacent fins 64 do not merge together and remain separate source/drain regions 80 (see FIG. 14C). In some exemplary embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise silicon germanium (SiGe), and a p-type impurity such as boron or indium. In some embodiments, silicon germanium in the source/drain regions 80 is formed to have a higher atomic percentage of germanium than silicon germanium in the channel region of the FinFET device, such that compressive strain is induced in the channel region of the FinFET device.

FIG. 14B illustrates a cross-sectional view of the FinFET device 100 shown in FIG. 14A, but along cross-section C-C, in an embodiment. In the example of FIG. 14B, the epitaxial source/drain regions 80A and 80B merge to form a continuous epitaxial source/drain region 80. FIG. 14C illustrates the cross-sectional view of the FinFET device 100 shown in FIG. 14A, but along cross-section C-C, in another embodiment. In the example of FIG. 14C, the epitaxial source/drain regions 80A and 80B do not merge and remain separate source/drain regions 80.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about 1E19 cm$^{-3}$ to about 1E21 cm$^{-3}$. In some embodiments, the epitaxial source/drain regions may be in situ doped during growth.

Figure 15:
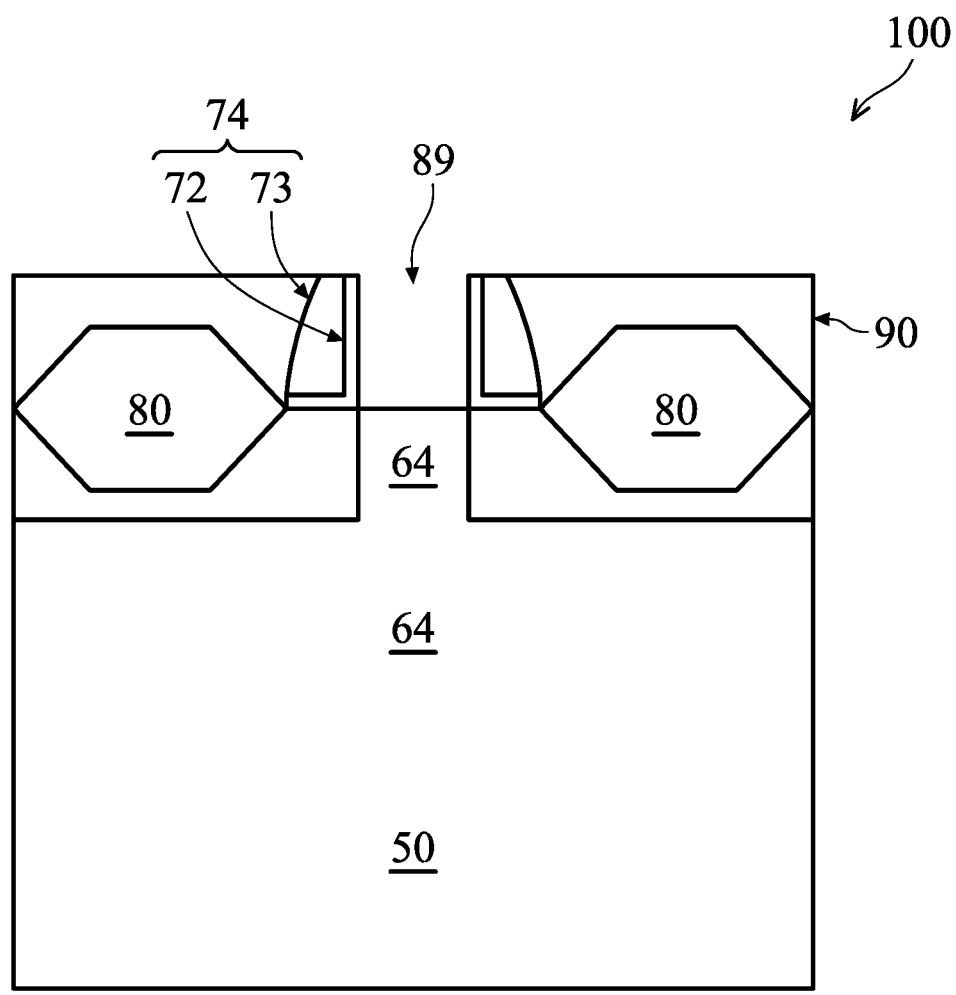
Figure 16:
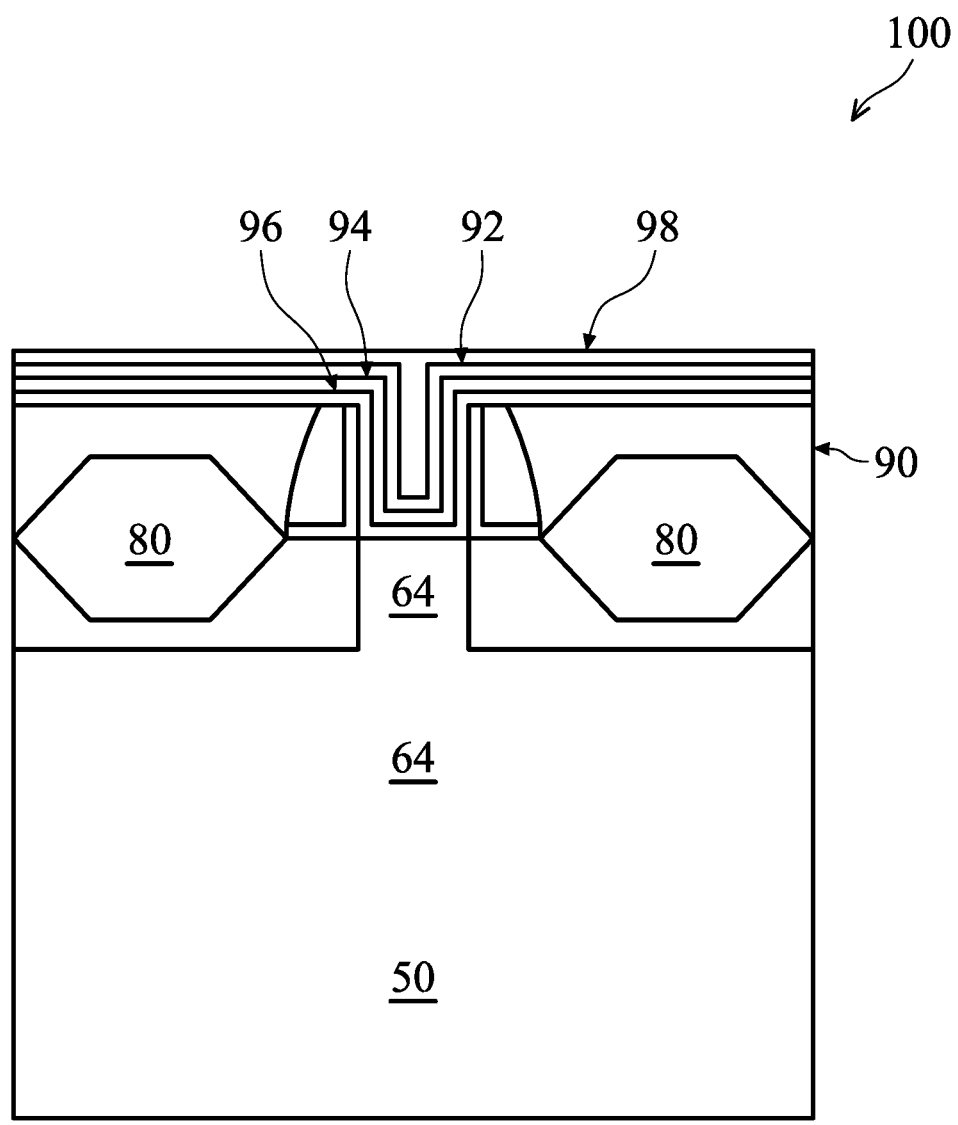
Figure 17:
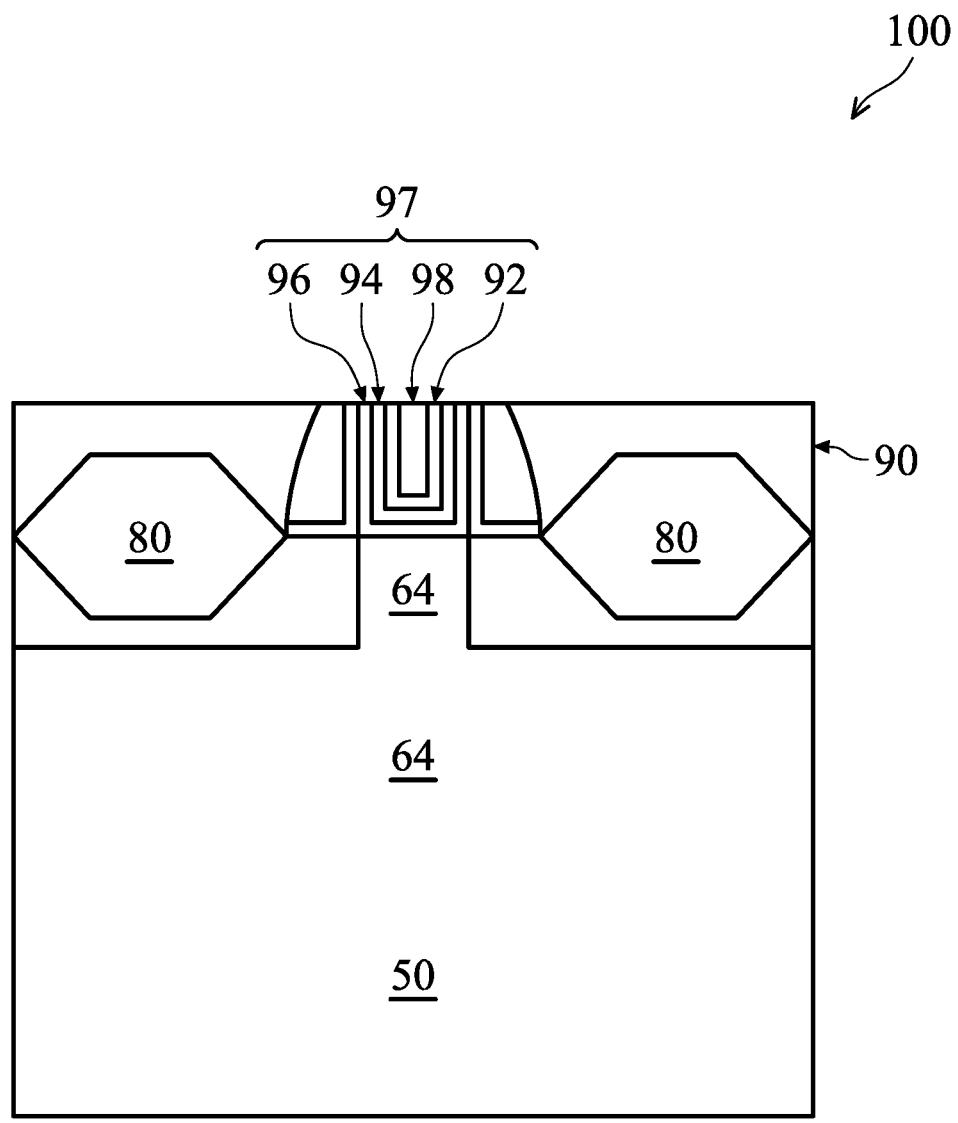

Next, as illustrated in FIGS. 15-17, a first interlayer dielectric (ILD) 90 is formed over the structure illustrated in FIG. 14A, and a gate-last process (sometimes referred to as a replacement gate process) is performed. In a gate-last process, the gate 68 and the gate dielectric 66 (see FIG. 14A) are considered dummy structures and are removed and replaced with an active gate and active gate dielectric.

Referring to FIG. 15, the first ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD, in some embodiments. A planarization process, such as a CMP process, may be performed to remove the mask 70, and to planarize the top surface of the first ILD 90 such that the top surface of the first ILD 90 is level with the top surface of the gate 68. Therefore, after the CMP process, the top surface of the gate 68 is exposed, in some embodiments.

In accordance with some embodiments, the gate 68 and the gate dielectric 66 directly under the gate 68 are removed in an etching step(s), so that recesses 89 are formed between respective spaces 74. Each recess 89 exposes a channel region of a respective fin 64. Each channel region is disposed between neighboring pairs of epitaxial source/drain regions 80. During the dummy gate removal, the dummy gate dielectric layer 66 may be used as an etch stop layer when the dummy gate 68 is etched. The dummy gate dielectric layer 66 may then be removed after the removal of the dummy gate 68.

Next, in FIG. 16, a gate dielectric layer 96, a barrier layer 94, a seed layer 92, and a gate electrode 98 are formed for replacement gate 97 (see FIG. 17). The gate dielectric layer 96 is deposited conformally in the recess 89, such as on the top surfaces and the sidewalls of the fins 64 and on sidewalls of the first gate spacers 72, and on a top surface of the first ILD 90. In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the barrier layer 94 is formed conformally over the gate dielectric layer 96. The barrier layer 94 may comprise an electrically conductive material such as titanium nitride, although other materials, such as tantalum nitride, titanium, tantalum, or the like, may alternatively be utilized. The barrier layer 94 may be formed using a CVD process, such as plasma-enhanced CVD (PECVD). However, other alternative processes, such as sputtering or metal organic chemical vapor deposition (MOCVD), atomic layer deposition (ALD), may alternatively be used.

Although not illustrated in FIG. 16, work function layers may be formed in the replacement gate 97, e.g., over the barrier layer 94. For example, P-type work function layer(s) may be formed in the region 200, and N-type work function layer(s) may be formed in the region 300. Exemplary P-type work function metals that may be included in the gate structure (e.g., 97) include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structure include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed in the respective region. The work function layer(s) may be deposited by CVD, physical vapor deposition (PVD), and/or other suitable process.

Next, the seed layer 92 is formed over the barrier layer 94 (or the work function layers if formed). The seed layer 92 may include copper (Cu), titanium (Ti), tantalum (Ta), titanium nitride (TiN), tantalum nitride (TaN), the like, or a combination thereof, and may be deposited by atomic layer deposition (ALD), sputtering, physical vapor deposition (PVD), or the like. In some embodiments, the seed layer is a metal layer, which may be a single layer or a composite layer comprising a plurality of sub-layers formed of different materials. In some embodiments, the seed layer comprises a titanium layer and a copper layer over the titanium layer.

Next, the gate electrode 98 is deposited over the seed layer 92, and fills the remaining portions of the recess 89. The gate electrode 98 may be made of a metal-containing material such as TiN, TaN, TaC, Co, Ru, Al, combinations thereof, or multilayers thereof, and may be formed by, e.g., electroplating, electroless plating, or other suitable method.

Next, as illustrated in FIG. 17, after the formation of the gate electrode 98, a planarization process, such as a CMP, may be performed to remove the excess portions of the gate dielectric layer 96, the barrier layer 94, the work function layer(s) (if formed), the seed layer 92, and the material of the gate electrode 98, which excess portions are over the top surface of first ILD 90. The resulting remaining portions of material of the gate electrode 98, the seed layer 92, the work function layer(s) (if formed), the barrier layer 94, and the gate dielectric layer 96 thus form a replacement gate 97 of the resulting FinFET device 100.

Figure 18:
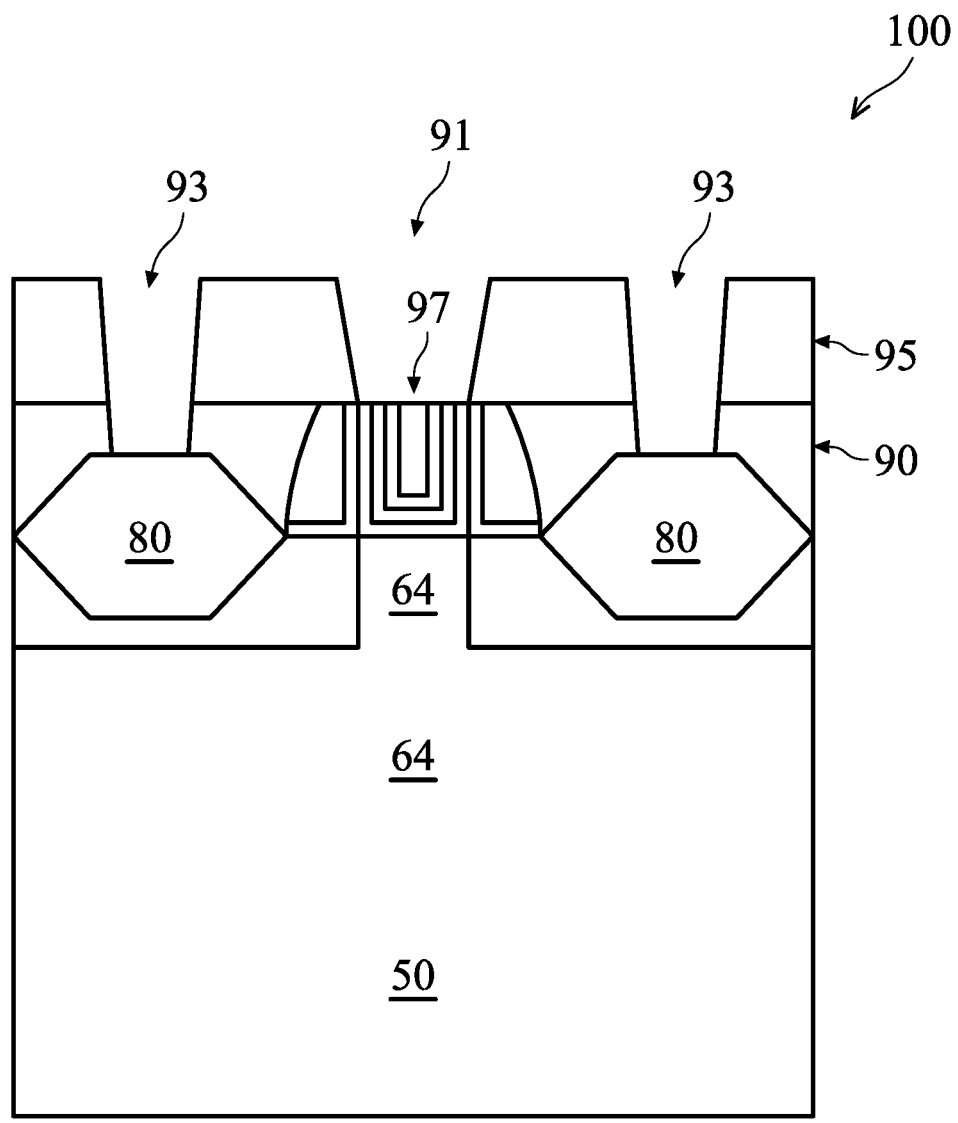

Next, in FIG. 18, a second ILD 95 is deposited over the first ILD 90. In an embodiment, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Contact openings 91 and 93 for contacts 102 (see FIGS. 21A and 21B) are formed through the first ILD 90 and/or the second ILD 95. For example, the contact opening 91 is formed through the second ILD 95 and exposes the replacement gate 97, while the contact openings 93 are formed through the first ILD 90 and the second ILD 95, and exposes source/drain regions 80.

Figure 19:
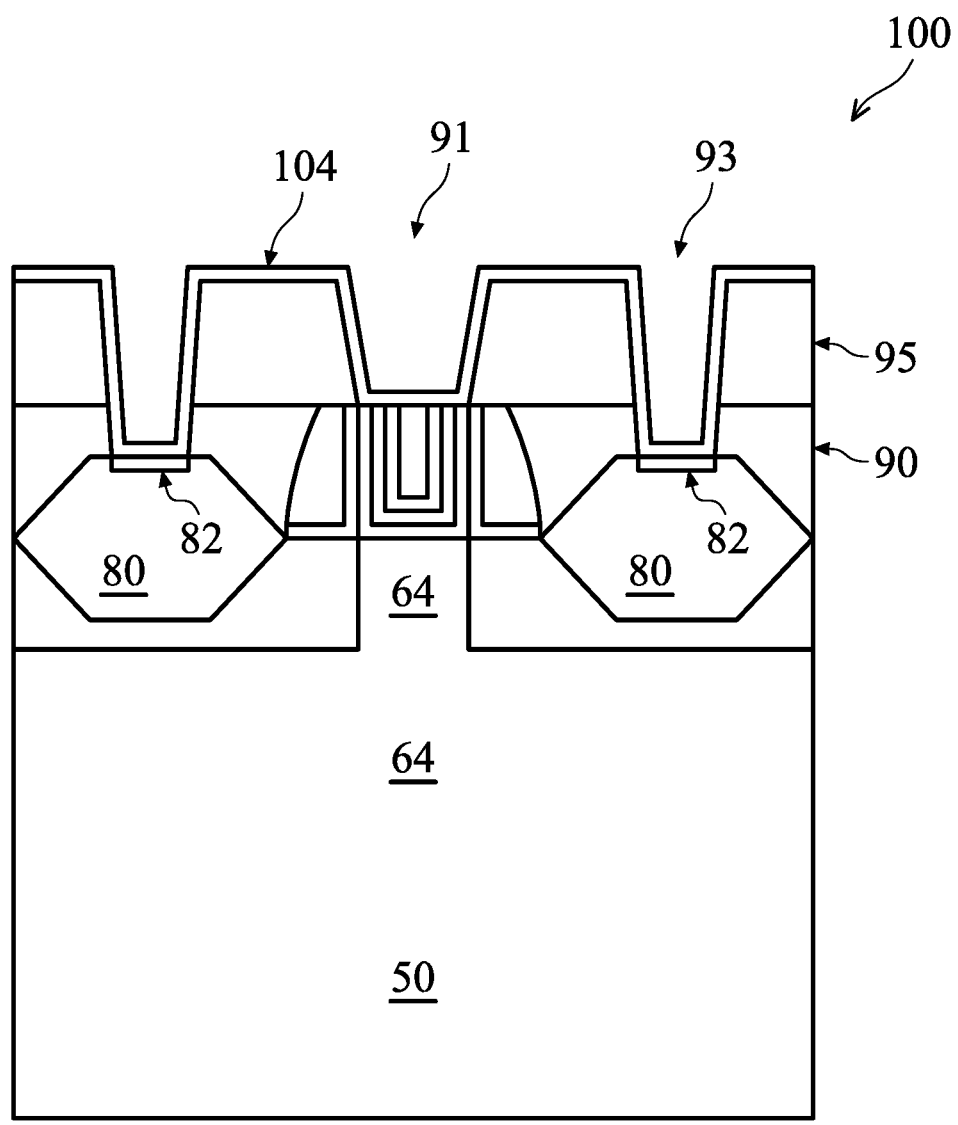

Next, in FIG. 19, silicide regions 82 are formed over the source/drain regions 80, and a barrier layer 104 is formed over the silicide regions 82 and the second ILD 95. In some embodiments, the silicide regions 82 are formed by depositing, over the source/drain regions 80, a metal capable of reacting with semiconductor materials (e.g., silicon, germanium) to form silicide or germanide regions. The metal may be nickel, cobalt, titanium, tantalum, platinum, tungsten, other noble metals, other refractory metals, rare earth metals or their alloys. A thermal anneal process is then performed so that the deposited metal reacts with the source/drain regions 80 to form silicide regions 82. After the thermal anneal process, the unreacted metal is removed.

The barrier layer 104 is conformally formed over the silicide regions 82 and the second ILD 95, and lines sidewalls and bottoms of the contact openings 91/93. The barrier layer 104 may comprise an electrically conductive material such as titanium (Ti), titanium nitride (TiN), tantalum (Ta), tantalum nitride (TaN), or the like, and may be formed using a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used.

Figure 20:
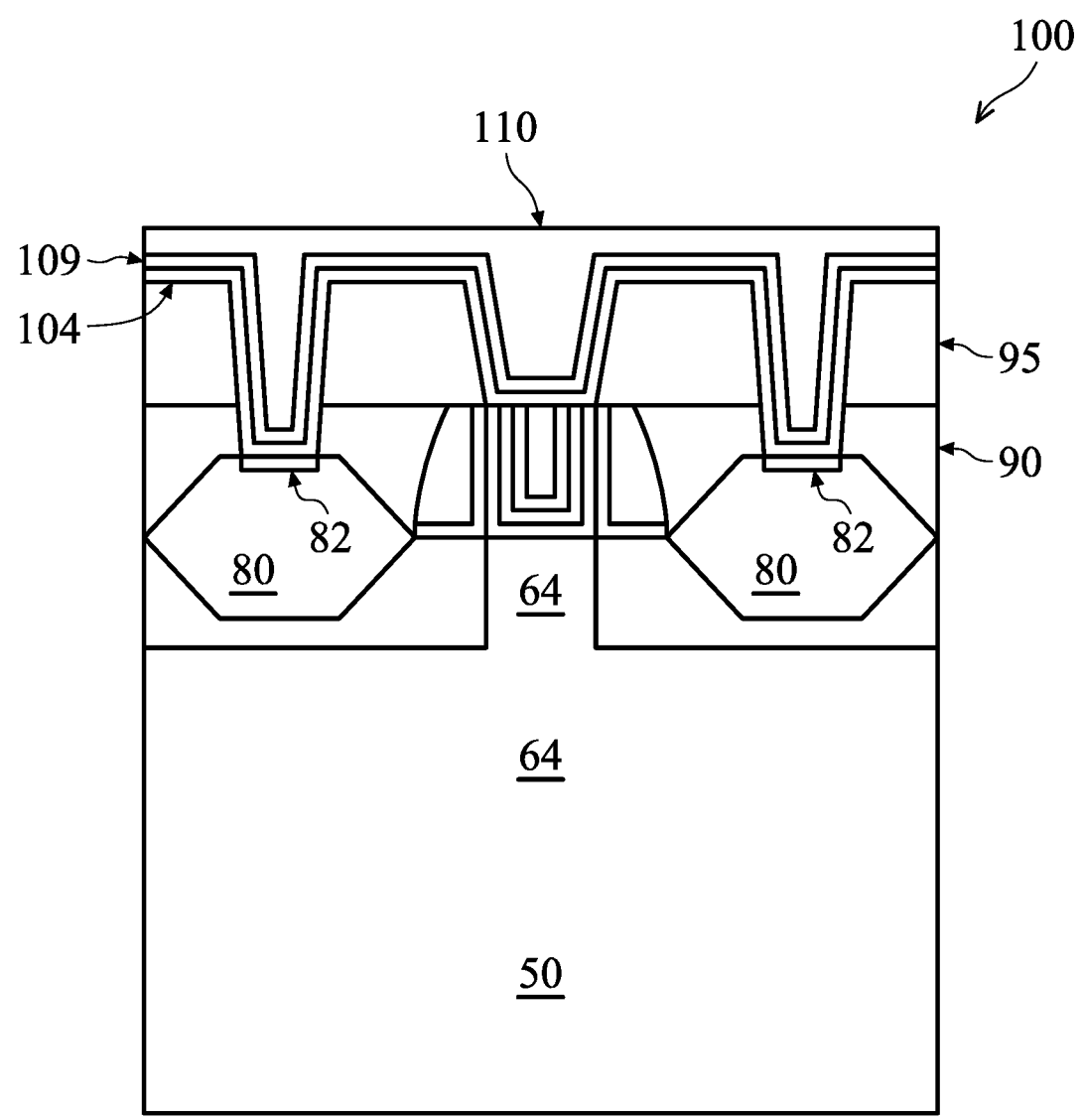

Next, in FIG. 20, a seed layer 109 is formed over the barrier layer 104, and an electrically conductive material 110 is formed over the seed layer 109. The seed layer 109 may be deposited by PVD, ALD or CVD, and may be formed of tungsten, copper, or copper alloys, although other suitable methods and materials may alternatively be used.

Once the seed layer 109 has been formed, the conductive material 110 may be formed onto the seed layer 109 to fill the contact openings 91/93. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Figure 21A:
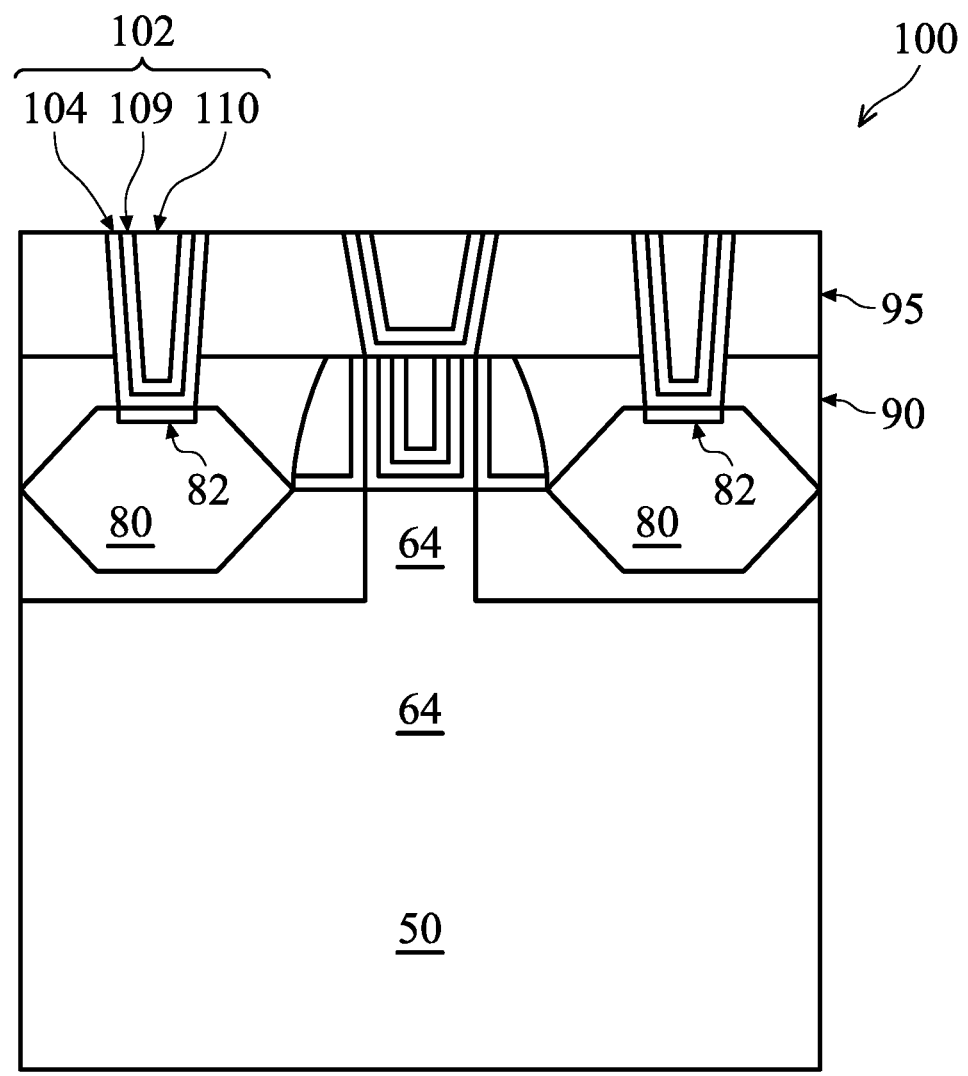
Figure 21B:
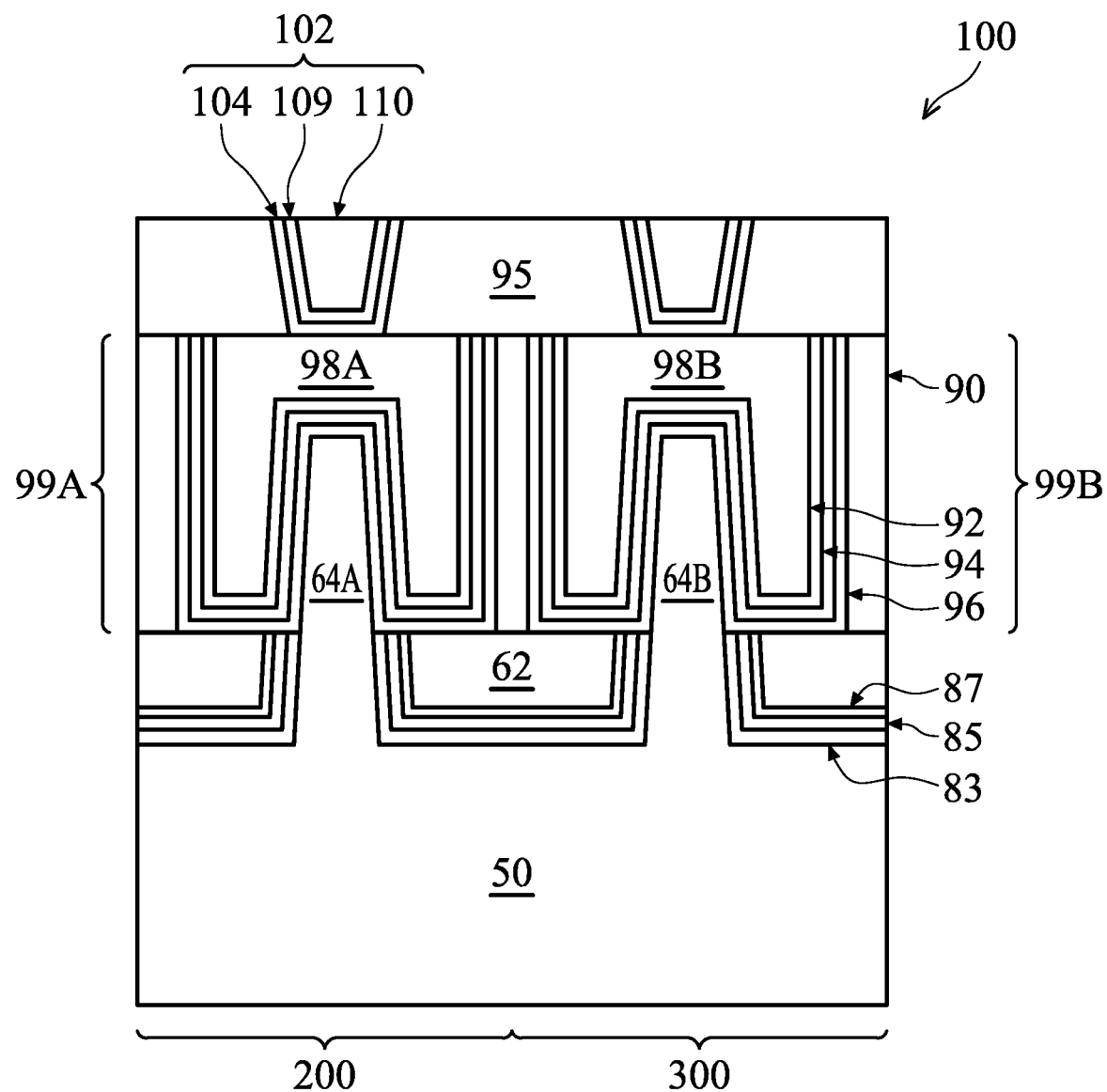

Referring next to FIG. 21A, once the contact openings 91/93 have been filled, excess barrier layer 104, seed layer 109, and conductive material 110 outside of the contact openings 91/93 may be removed through a planarization process such as CMP, although any suitable removal process may be used. Contact plugs 102 are thus formed in the contact openings 91/93. Although contact plugs 102 over the source/drain regions 80 and over the replacement gate 97 are illustrated in a same cross-section in FIG. 21A, the contact plugs 102 may be in different cross-sections in the FinFET device 100.

FIG. 21B illustrates the cross-sectional view of the FinFET device 100 shown in FIG. 21A, but along cross-section B-B, in some embodiments. In FIG. 21B, a first replacement gate 99A (e.g., comprising gate dielectric 96/barrier layer 94/seed layer 92/gate electrode 98A) is formed over the fin 64A, and a second replacement gate 99B (e.g., comprising gate dielectric 96/barrier layer 94/seed layer 92/gate electrode 98B) is formed over the fin 64B. The first replacement gate 99A is separated from the second replacement gate 99B, e.g., by the first ILD 90. A first contact plug 102 is electrically coupled to the gate electrode 98A, and a second contact plug 102 is electrically coupled to the gate electrode 98B.

Although not shown, the gate spacers 74 (see FIG. 13) may be formed between the replacement gates (e.g., 99A and 99B) and the first ILD 90 (e.g., along sidewalls of the replacement gates 99A and 99B) in the cross-sectional view of FIG. 21B. For example, the gate spacers 74 may be formed along the two sidewalls of the first replacement gate 99A and along the two sidewalls of the second replacement gate 99B in the cross-sectional view of FIG. 21B. For example, in such embodiments, the gate spacers 74 are formed between the first replacement gate 99A and the second replacement gate 99B. In some embodiments, the gate spacers 74 are not formed between the first replacement gate 99A and the second replacement gate 99B, but are formed on exterior sidewalls (e.g., the leftmost sidewall of the first replacement gate 99A and the rightmost sidewall of the second replacement gate 99B in FIG. 21B) of the replacement gates 99A and 99B. In yet other embodiments, the gate spacers 74 are not formed in the cross-sectional view of FIG. 21B. These and other variations of the gate spacers 74 are fully intended to be included within the scope of the present disclosure.

Variations and modifications to the present disclosure are possible and are fully intended to be included within the scope of the present disclosure. For example, more than one fins may be formed in each of the regions 200 and 300, and more than one gates may be formed over the fins 64. The formation of the fins 64 may include other processing steps, and the materials of the fins 64A and 64B may or may not be the same. In addition, in the replacement gate process discussed above, dummy gate structures 75A and 75B are separated from each other before being replaced by replacement gates 97. In other embodiments, it is possible to form a dummy gate structure that extends continuously from the fin 64A to the fin 64B, then replacing the dummy gate structure with a replacement gate that extends continuously from the fin 64A to the fin 64B, and subsequently, the replacement gate is cut (e.g., by etching an opening between the fins 64A and 64B, and filling the opening with a dielectric material) to form two separate replacement gates (one on each of the fins 64A and 64B). These and other variations are fully intended to be included within the scope of the present disclosure.

Figure 22:
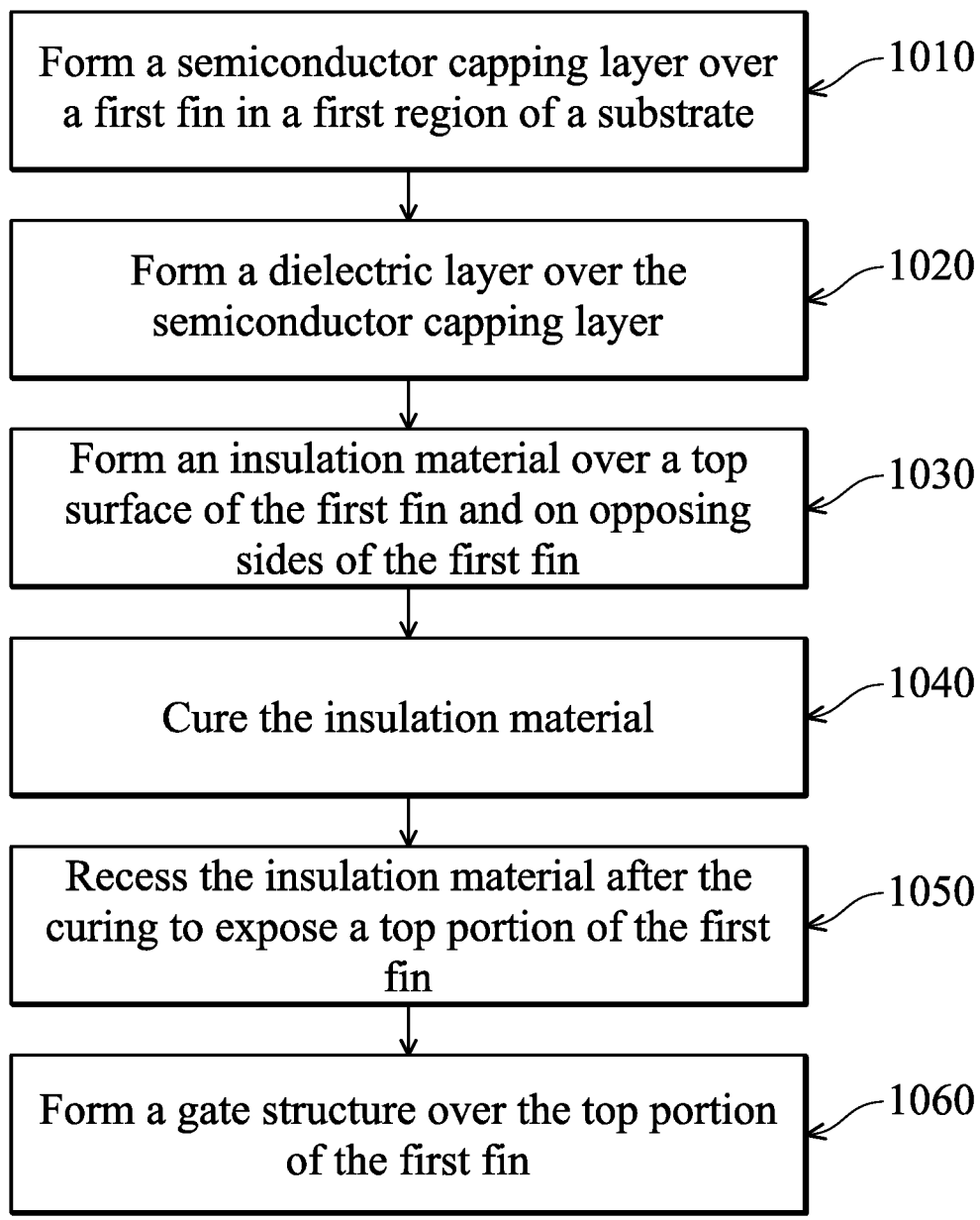
FIG. 22 illustrates a flow chart of a method for forming a semiconductor device, in accordance with some embodiments.

FIG. 22 illustrates a flow chart of a method of forming a semiconductor device, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged and repeated.

Referring to FIG. 22, at step 1010, a semiconductor capping layer is formed over a first fin in a first region of a substrate. At step 1020, a dielectric layer is formed over the semiconductor capping layer. At step 1030, an insulation material is formed over a top surface of the first fin and on opposing sides of the first fin. At step 1040, the insulation material is cured. At step 1050, the insulation material is recessed after the curing to expose a top portion of the first fin. At step 1060, a gate structure is formed over the top portion of the first fin.

Embodiments may achieve advantages. The capping layer 83 and the dielectric liner stack 88 provides structural support for the fins 64 to reduce or prevent collapse of the fins in subsequent processing. In addition, the dielectric liner stack 88 isolates the fins 64 from oxygen in subsequent anneal process(es), thus reducing or avoiding oxidization of the fins. Designed fin dimensions (e.g., fin width, fin pitch) are preserved, which advantageously improves the electrical performance of the device formed. The nitridation treatment of the capping layer 83 provides an additional thin film of nitride to reduce or prevent penetration of oxygen into the fins, further reducing the probability of oxidation of the fins.

In an embodiment, a method includes forming a semiconductor capping layer over a first fin in a first region of a substrate; forming a dielectric layer over the semiconductor capping layer; forming an insulation material over the dielectric layer, an upper surface of the insulation material extending further away from the substrate than an upper surface of the first fin; recessing the insulation material to expose a top portion of the first fin; and forming a gate structure over the top portion of the first fin. In an embodiment, the method further comprises before forming the semiconductor capping layer: replacing a first portion of the substrate in the first region with an epitaxial semiconductor material; and patterning the epitaxial semiconductor material to form the first fin. In an embodiment, forming the semiconductor capping layer includes forming a silicon capping layer over the first fin. In an embodiment, the method further includes treating the semiconductor capping layer with a nitride-containing gas before forming the dielectric layer over the semiconductor capping layer. In an embodiment, forming the dielectric layer includes forming a dielectric layer comprising a nitride of a material of the semiconductor capping layer. In an embodiment, the method further includes curing the insulation material before recessing the insulation material. In an embodiment, the semiconductor capping layer is a silicon capping layer, and the dielectric layer is a silicon nitride layer, where curing the insulation material converts a top layer of the dielectric layer into silicon oxynitride. In an embodiment, the curing includes performing a first anneal process; performing a planarization process after the first anneal process; and performing a second anneal process. In an embodiment, the planarization process removes top portions of the insulation material and exposes a mask layer over the upper surface of the first fin. In an embodiment, performing the first anneal process includes performing a first wet steam anneal; and performing a first dry anneal after the first wet steam anneal. In an embodiment, the first dry anneal is performed in an ambient comprising nitrogen. In an embodiment, performing the second anneal process includes performing a second wet steam anneal; and performing a second dry anneal after the second wet steam anneal. In an embodiment, the first region is a PMOS region, where the method further includes forming a second fin in an NMOS region of the substrate that is adjacent to the PMOS region, where the semiconductor capping layer and the dielectric layer are formed over the first fin and over the second fin.

In an embodiment, a method of forming Fin Field-Effect Transistor (FinFET) device includes forming a first fin in a PMOS region of a substrate; forming a second fin in an NMOS region of the substrate adjacent to the PMOS region; and forming a silicon capping layer over the first fin and the second fin. The method also includes performing a nitridation treatment on the silicon capping layer; forming a first dielectric material over the silicon capping layer; depositing a second dielectric material between and over the first fin and the second fin, where the first dielectric material is between the silicon capping layer and the second dielectric material; and performing a thermal process to cure the second dielectric material. The method further includes recessing the second dielectric material after the thermal process to expose a top portion of the first fin and a top portion of the second fin; and forming a first gate structure over the first fin and a second gate structure over the second fin. In an embodiment, forming the silicon capping layer includes forming the silicon capping layer conformally over the first fin and the second fin. In an embodiment, performing the nitridation treatment includes treating the silicon capping layer with a gas comprising ammonia. In an embodiment, forming the first dielectric material includes conformally forming a layer of silicon nitride over the silicon capping layer, where performing the thermal process converts a top layer of the first dielectric material into silicon oxynitride.

In an embodiment, a Fin Field-Effect Transistor (FinFET) device includes a fin protruding above upper surfaces of isolation regions on opposing sides of the fin; a silicon capping layer between the fin and the isolation regions; a first dielectric material between the silicon capping layer and the isolation regions; and a second dielectric material different from the first dielectric material between the first dielectric material and the isolation regions, the second dielectric material including an oxide of the first dielectric material. In an embodiment, the first fin includes silicon germanium, the first dielectric material includes silicon nitride, and the second dielectric material includes silicon oxynitride. In an embodiment, the FinFET device further includes a silicon oxide film between the silicon capping layer and the first dielectric material.

In an embodiment, a Fin Field-Effect Transistor (FinFET) device includes a first fin; a second fin adjacent to the first fin, the second fin having a different material from the first fin; isolation regions between the first fin and the second fin, where an upper portion of the first fin and an upper portion of the second fin protrude above the isolation regions; and a semiconductor capping layer between a lower portion of the first fin and the isolation regions, and between a lower portion of the second fin and the isolation regions. The FinFET device further includes a first dielectric layer between the semiconductor capping layer and the isolation regions; and a second dielectric layer different from the first dielectric layer between the first dielectric layer and the isolation regions. In an embodiment, the fin includes silicon germanium, and the second fin comprises silicon. In an embodiment, the first fin has P-type source/drain regions, and the second fin has N-type source/drain regions. In an embodiment, the first dielectric layer includes silicon nitride, and the second dielectric layer includes silicon oxynitride. In an embodiment, the FinFET device further includes a film of oxide between the semiconductor capping layer and the first dielectric layer, where the film of oxide includes an oxide of a material of the semiconductor capping layer.

In an embodiment, a method of forming a semiconductor device includes forming a semiconductor liner over a fin that protrudes from a substrate; forming a silicon nitride layer conformally over the semiconductor liner; and depositing an isolation material over and around the fin. The method also includes curing the isolation material using a thermal process, where curing the isolation material converts an upper layer of the silicon nitride layer distal the substrate into silicon oxynitride; removing portions of the isolation material to form shallow trench isolation (STI) regions, where the fin protrudes above the STI regions; and forming a gate over the fin. In an embodiment, the method further includes treating the semiconductor liner with nitrogen to form a dielectric film over the semiconductor liner, the dielectric film including a nitride of the semiconductor liner. In an embodiment, the curing includes performing a first thermal anneal process to cure at least a top portion of the isolation material; recessing the isolation material after the first thermal anneal process; and performing a second thermal anneal process after recessing the isolation material. In an embodiment, performing the first thermal anneal process includes performing a wet anneal process; and performing a dry anneal process after the wet anneal process.

In an embodiments, a method includes forming a first fin having silicon germanium in a PMOS region of a substrate; forming a second fin having silicon in an NMOS region of the substrate; forming a silicon capping layer over the first fin and the second fin; and forming a dielectric layer comprising silicon nitride over the silicon capping layer. The method also includes forming an isolation material between the first fin and the second fin; curing the isolation material, where curing the isolation material converts an upper layer of the dielectric layer into silicon oxynitride; recessing the isolation material to expose a top portion of the first fin and a top portion of the second fin; and forming a first gate structure and a second gate structure over the first fin and the second fin, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Fin Field-Effect Transistor (FinFET) device comprising:
   a substrate;
   a fin protruding above the substrate;
   isolation regions on opposing sides of the fin;
   a silicon capping layer between the fin and the isolation regions;
   a first dielectric material between the silicon capping layer and the isolation regions; and
   a second dielectric material different from the first dielectric material between the first dielectric material and the isolation regions, the second dielectric material comprising an oxide of the first dielectric material, wherein the first dielectric material and the second dielectric material form a dielectric liner stack, wherein the dielectric liner stack has a non-uniform concentration of oxygen.

2. The FinFET device of claim 1, wherein a top portion of the fin distal from the substrate comprises a first semiconductor material, and a bottom portion of the fin proximate to the substrate comprises a second semiconductor material different from the first semiconductor material.

3. The FinFET device of claim 2, wherein the first semiconductor material is silicon germanium, wherein the bottom portion of the fin and the substrate comprise the second semiconductor material.

4. The FinFET device of claim 1, wherein the first dielectric material comprises silicon nitride, and the second dielectric material comprises silicon oxynitride.

5. The FinFET device of claim 1, wherein a ratio between a thickness of the second dielectric material and a thickness of the first dielectric material is about 1:2.

6. The FinFET device of claim 1, wherein the dielectric liner stack has a first portion distal from the substrate, a third portion proximate to the substrate, and a second portion between the first portion and the third portion, wherein an atomic percentage of oxygen in the dielectric liner stack has a gradient along a direction from the first portion of the dielectric liner stack toward the third portion of the dielectric liner stack.

7. The FinFET device of claim 6, wherein the atomic percentage of oxygen in the dielectric liner stack decreases along the direction from the first portion of the dielectric liner stack toward the third portion of the dielectric liner stack.

8. The FinFET device of claim 6, wherein the dielectric liner stack comprises silicon (Si), nitrogen (N), and oxygen (O), wherein an atomic percentage ratio between Si, N, and O is about 5:2.5:2.5 in the first portion of the dielectric liner stack, about 5:3:2 in the second portion of the dielectric liner stack, and about 5:4:1 in the third portion of the dielectric liner stack.

9. The FinFET device of claim 1, further comprising:
a gate dielectric layer over the fin and over the isolation regions; and
a gate electrode over the gate dielectric layer.

10. The FinFET device of claim 9, wherein the gate dielectric layer physically contacts end surfaces of the silicon capping layer, end surfaces of the first dielectric material, and end surfaces of the second dielectric material.

11. The FinFET device of claim 1, wherein the silicon capping layer is a semiconductive material comprising silicon.

12. A Fin Field-Effect Transistor (FinFET) device comprising:
a fin protruding above a substrate;
isolation regions on opposing sides of the fin, the fin protruding above upper surfaces of the isolation regions;
a capping layer between the fin and the isolations regions, the capping layer contacting sidewalls of the fin;
a dielectric liner stack between the capping layer and the isolation regions, wherein the dielectric liner stack comprises:
a first dielectric layer over and extending along the capping layer; and
a second dielectric layer over and extending along the first dielectric layer, the second dielectric layer comprising an oxide of the first dielectric layer, wherein a concentration of oxygen in the dielectric liner stack is non-uniform.

13. The FinFET device of claim 12, wherein the second dielectric layer contacts the isolation regions.

14. The FinFET device of claim 13, wherein the first dielectric layer contacts the capping layer and the second dielectric layer.

15. The FinFET device of claim 12, wherein the capping layer comprises a silicon layer.

16. The FinFET device of claim 12, wherein the first dielectric layer comprise silicon nitride, and the second dielectric layer comprises silicon oxynitride.

17. The FinFET device of claim 12, wherein an atomic percentage of oxygen in the dielectric liner stack has a gradient along a first direction from a top portion of the dielectric liner stack distal to the substrate to a bottom portion of the dielectric liner stack proximate to the substrate.

18. A Fin Field-Effect Transistor (FinFET) device comprising:
a fin over a substrate;
isolation regions on opposing sides of the fin, wherein an upper portion of the fin protrudes above an upper surface of the isolation regions, wherein a lower portion of the fin is between the upper surface of the isolation region and the substrate;
a silicon capping layer extending along sidewalls of the lower portion of the fin; and
a dielectric liner stack between the silicon capping layer and the isolation regions, wherein the dielectric liner stack comprises:
a first dielectric layer over the silicon capping layer; and
a second dielectric layer over the first dielectric layer, the second dielectric layer being an oxide of the first dielectric layer, wherein the dielectric liner stack has a non-uniform concentration of oxygen.

19. The FinFET device of claim 18, the first dielectric layer comprises silicon nitride, and the second dielectric layer comprises silicon oxynitride.

20. The FinFET device of claim 18, wherein an atomic percentage of oxygen in the dielectric liner stack decreases gradually along a direction from a top portion of the dielectric liner stack distal from the substrate toward a bottom portion of the dielectric liner stack proximate to the substrate.

* * * * *